United States Patent
Lin et al.

(10) Patent No.: US 10,665,709 B2
(45) Date of Patent: May 26, 2020

(54) POWER SEMICONDUCTOR DEVICE INTEGRATED WITH ESD PROTECTION CIRCUIT UNDER SOURCE PAD, DRAIN PAD, AND/OR GATE PAD

(71) Applicant: DELTA ELECTRONICS, INC., Taoyuan (TW)

(72) Inventors: Li-Fan Lin, Taoyuan (TW); Po-Chin Peng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/468,133

(22) Filed: Mar. 24, 2017

(65) Prior Publication Data

US 2017/0194477 A1     Jul. 6, 2017

Related U.S. Application Data

(63) Continuation-in-part of application No. 15/297,123, filed on Oct. 18, 2016, now Pat. No. 10,084,076.
(Continued)

(30) Foreign Application Priority Data

| Sep. 10, 2013 | (TW) | ............................. 102132512 A |
| Feb. 27, 2014 | (TW) | ............................. 103106659 A |
| Apr. 21, 2014 | (TW) | ............................. 103114340 A |

(51) Int. Cl.
*H01L 29/778*     (2006.01)
*H01L 23/535*     (2006.01)
(Continued)

(52) U.S. Cl.
CPC ........ *H01L 29/7787* (2013.01); *H01L 23/482* (2013.01); *H01L 23/535* (2013.01);
(Continued)

(58) Field of Classification Search
CPC ............ H01L 29/7787; H01L 27/0883; H01L 23/49537; H01L 23/49541; H01L 23/49562; H01L 23/49575
See application file for complete search history.

(56) References Cited

U.S. PATENT DOCUMENTS

| 5,767,546 A | 6/1998 | Williams et al. |
| 7,072,161 B2 | 7/2006 | Chen |

(Continued)

FOREIGN PATENT DOCUMENTS

| CN | 1321340 A | 11/2001 |
| CN | 1973377 A | 5/2007 |

(Continued)

OTHER PUBLICATIONS

Li-Fan Lin et al., "Semiconductor Device", U.S. Appl. No. 15/429,184, filed Feb. 10, 2017.

*Primary Examiner* — Matthew E. Gordon
(74) *Attorney, Agent, or Firm* — CKC & Partners Co., LLC

(57) ABSTRACT

A semiconductor device includes a substrate, a power device, a protection circuit, a dielectric layer, a drain pad, a source pad, and a gate pad. The power device and the protection circuit are disposed on the substrate. The power device includes a drain electrode, a source electrode, and a gate electrode. The protection circuit has a first terminal electrically connected with the source pad and a second terminal electrically connected with the gate pad. The dielectric layer is disposed on the power device and the protection circuit. The drain pad, the source pad, and the gate pad are disposed on the dielectric layer and respectively electrically connected with the drain electrode, the source electrode, and the gate electrode. At least part of the protection circuit is disposed under the source pad, the gate pad, or the drain pad.

20 Claims, 21 Drawing Sheets

Related U.S. Application Data which is a continuation of application No. 14/496,471, filed on Sep. 25, 2014, now Pat. No. 9,508,843, which is a continuation-in-part of application No. 14/185,322, filed on Feb. 20, 2014, now Pat. No. 8,957,493.

(51) Int. Cl.
| | |
|---|---|
| *H01L 29/40* | (2006.01) |
| *H01L 29/417* | (2006.01) |
| *H01L 23/00* | (2006.01) |
| *H01L 23/482* | (2006.01) |
| *H01L 29/20* | (2006.01) |
| *H01L 27/06* | (2006.01) |
| *H01L 27/02* | (2006.01) |
| *H01L 29/10* | (2006.01) |
| *H01L 21/8252* | (2006.01) |

(52) U.S. Cl.
CPC .......... *H01L 24/06* (2013.01); *H01L 27/0251* (2013.01); *H01L 27/0605* (2013.01); *H01L 27/0629* (2013.01); *H01L 29/2003* (2013.01); *H01L 29/402* (2013.01); *H01L 29/41758* (2013.01); *H01L 29/7786* (2013.01); *H01L 21/8252* (2013.01); *H01L 24/48* (2013.01); *H01L 29/1066* (2013.01); *H01L 2224/04042* (2013.01); *H01L 2224/05093* (2013.01); *H01L 2224/0603* (2013.01); *H01L 2224/48137* (2013.01); *H01L 2224/48247* (2013.01); *H01L 2224/48257* (2013.01); *H01L 2224/49111* (2013.01); *H01L 2924/00014* (2013.01); *H01L 2924/1033* (2013.01); *H01L 2924/10344* (2013.01); *H01L 2924/13064* (2013.01)

(56) References Cited

U.S. PATENT DOCUMENTS

| | | | |
|---|---|---|---|
| 7,800,131 | B2 | 9/2010 | Miyamoto et al. |
| 7,928,475 | B2 | 4/2011 | Parikh et al. |
| 8,237,196 | B2 | 8/2012 | Saito |
| 8,530,978 | B1 | 9/2013 | Chu et al. |
| 8,691,684 | B2 | 4/2014 | Zhong et al. |
| 9,508,843 | B2 | 11/2016 | Lin et al. |
| 10,236,236 | B2 | 3/2019 | Lin et al. |
| 2003/0076639 | A1 | 4/2003 | Chen |
| 2003/0082860 | A1 | 5/2003 | Yoshida |
| 2005/0189562 | A1 | 9/2005 | Kinzer |
| 2007/0007545 | A1 | 1/2007 | Salcedo et al. |
| 2007/0108617 | A1 | 5/2007 | Heiling et al. |
| 2008/0272443 | A1 | 11/2008 | Hoshi et al. |
| 2008/0303097 | A1 | 12/2008 | Alter et al. |
| 2009/0108459 | A1* | 4/2009 | Motoyui ............ H01L 23/4824 257/773 |
| 2011/0193171 | A1* | 8/2011 | Yamagiwa .......... H01L 27/0266 257/355 |
| 2011/0248283 | A1 | 10/2011 | Cao et al. |
| 2013/0062625 | A1 | 3/2013 | Takada et al. |
| 2013/0146946 | A1 | 6/2013 | Tsurumi et al. |
| 2013/0161692 | A1 | 6/2013 | Koudymov |
| 2013/0207120 | A1 | 8/2013 | Cheah et al. |
| 2014/0001515 | A1* | 1/2014 | Kudymov ............ H01L 29/404 257/192 |
| 2016/0043643 | A1 | 2/2016 | Ujita et al. |
| 2017/0154839 | A1 | 6/2017 | Lin et al. |

FOREIGN PATENT DOCUMENTS

| | | |
|---|---|---|
| CN | 102544002 A | 7/2012 |
| CN | 103178106 A | 6/2013 |
| TW | 200633211 | 9/2006 |
| TW | 201036156 A | 10/2010 |
| TW | 201338113 A | 9/2013 |
| TW | 201340316 A | 10/2013 |
| TW | 201511267 A | 3/2015 |
| TW | 201533906 A | 9/2015 |

* cited by examiner

(12) United States Patent

POWER SEMICONDUCTOR DEVICE INTEGRATED WITH ESD PROTECTION CIRCUIT UNDER SOURCE PAD, DRAIN PAD, AND/OR GATE PAD

CROSS-REFERENCE TO RELATED APPLICATIONS

The present application is a continuation-in-part application of U.S. application Ser. No. 15/297,123, filed Oct. 18, 2016, which is a continuation application of U.S. application Ser. No. 14/496,471, filed Sep. 25, 2014, which claims priority to Taiwan Application Serial Number 103106659, filed Feb. 27, 2014 and Taiwan Application Serial Number 103114340, filed Apr. 21, 2014, which are herein incorporated by reference in their entireties. U.S. application Ser. No. 14/496,471 is a continuation-in-part application of U.S. application Ser. No. 14/185,322, filed Feb. 20, 2014 which claims priority to Taiwan Application Serial Number 102132512, filed Sep. 10, 2013, which are herein incorporated by reference in their entireties.

BACKGROUND

Field of Invention

The present disclosure relates to a semiconductor device.

Description of Related Art

Rapid improvements in semiconductor processes have produced smaller and smaller transistors and other integrated devices. However, the miniaturization of these devices also increases their risk of damage by static electricity. Electrostatic discharge (ESD) arises when electrostatic charge accumulated on one object (for example a human body or a piece of equipment) is conducted onto a second object (for example a power device). This conduction of charge often results in damages to devices, whether through electrical over-voltage stress or through thermal stress caused by large currents. Thus, there is a need for an ESD protection circuit which may provide adequate ESD protection in the devices.

SUMMARY

An aspect of present disclosure is to provide a semiconductor device includes a substrate, a power device, a protection circuit, a dielectric layer, a drain pad, a source pad, and a gate pad. The power device is disposed on the substrate. The power device includes a drain electrode, a source electrode, and a gate electrode. The protection circuit is disposed on the substrate and has a first terminal and a second terminal. The dielectric layer is disposed on the power device and protection circuit. The drain pad is disposed on the dielectric layer and is electrically connected with the drain electrode of the power device. The source pad is disposed on the dielectric layer and is electrically connected with the source electrode of the power device and the first terminal. The gate pad is disposed on the dielectric layer and is electrically connected with the gate electrode of the power device and the second terminal. At least part of the protection circuit is disposed under the source pad, the gate pad, or the drain pad.

In some embodiments, the semiconductor device further includes a first protection circuit pad disposed on the dielectric layer. The first protection circuit pad is electrically connected with the first terminal and surrounded by the source pad.

In some embodiments, the first protection circuit pad is electrically connected with the source pad through a wire.

In some embodiments, the semiconductor device further includes a second protection circuit pad disposed on the dielectric layer. The second protection circuit pad is electrically connected with the second terminal and surrounding by the source pad.

In some embodiments, the semiconductor device further includes a first protection circuit pad and a second protection circuit pad. The first protection circuit pad is disposed on the dielectric layer and is electrically connected with the first terminal of the protection circuit. The second protection circuit pad is disposed on the dielectric layer and is electrically connected with the second terminal of the protection circuit. At least part of the source pad is disposed between the first protection circuit pad and the second protection circuit pad.

In some embodiments, the source pad includes a body portion and at least one branch portion. The body portion covers the protection circuit. The branch portion is disposed on the source electrode of the power device and connected to the body portion.

In some embodiments, at least part of the protection circuit is disposed under the source pad.

In some embodiments, at least part of the protection circuit is disposed under the gate pad.

In some embodiments, the protection circuit includes a protection active device, a first capacitor, a second capacitor, and a resistor. The protection active device has a source electrode, a drain electrode, and a gate electrode. The source electrode of the protection active device is electrically connected with the first terminal of the protection circuit, and the drain electrode of the protection active device is electrically connected with the second terminal of the protection circuit. The first capacitor is electrically connected between the drain electrode and the gate electrode of the protection active device. The second capacitor is electrically connected between the source electrode and the gate electrode of the protection active device. The resistor is electrically connected between the source electrode and the gate electrode of the protection active device.

In some embodiments, the first capacitor comprises a bottom electrode and a top electrode. The bottom electrode is electrically connected to the gate electrode of the protection active device. The top electrode is electrically connected to the drain electrode of the protection active device.

In some embodiments, the bottom electrode of the first capacitor and the gate electrode of the protection active device are integrally formed.

In some embodiments, the second capacitor includes a bottom electrode and a top electrode. The bottom electrode is electrically connected to the gate electrode of the protection active device. The top electrode is electrically connected to the source electrode of the protection active device.

In some embodiments, the bottom electrode of the second capacitor and the gate electrode of the protection active device are integrally formed.

In some embodiments, the protection circuit includes a first circuit and a second circuit electrically connected to and mirror symmetric to the first circuit.

In some embodiments, the protection circuit includes a protection active device, a diode, and a resistor. The protection active device includes a source electrode, a drain electrode, and a gate electrode. The source electrode of the protection active device is electrically connected with the first terminal, and the drain electrode of the protection active device is electrically connected with the second terminal. The diode is electrically connected between the drain electrode and the gate electrode of the protection active device. The resistor is electrically connected between the source electrode and the gate electrode of the protection active device.

In some embodiments, the diode includes an active layer, a source electrode, a drain electrode, and a gate electrode. The source electrode, the drain electrode, and the gate electrode are disposed on the active layer. The drain electrode of the diode is electrically connected to the gate electrode of the diode.

In some embodiments, the power device further includes an active layer. The source electrode, the drain electrode, and the gate electrode of the power device are disposed on the active layer. A projection of the source pad on the active layer forms a source pad region, a projection of the drain electrode of the power device on the active layer forms a drain region, and an area of an overlapping region between the source pad region and the drain region is smaller than or equal to 40% of an area of the drain region.

In some embodiments, a projection of the drain pad on the active layer forms a drain pad region, a projection of the source electrode of the power device on the active layer forms a source region, and an area of an overlapping region between the drain pad region and the source region is smaller than or equal to 40% of an area of the source region.

In some embodiments, the protection circuit includes a protective active device including an active layer, a source electrode, a drain electrode, a gate electrode, a source metal layer, and a drain metal layer. The source electrode, the drain electrode, and the gate electrode are disposed on the active layer. The source metal layer is disposed on the source electrode and is electrically connected to the source electrode. The source metal layer includes a body portion and at least one branch portion. The branch portion is disposed on the source electrode of the protective active device and is electrically connected to the source electrode of the protective active device and the body portion. The drain metal layer is disposed on the drain electrode and is electrically connected to the drain electrode.

In some embodiments, the protection circuit includes a resistor including an active path, an insulating region, a first terminal, and a second terminal. The active path includes a two-dimensional electron gas channel. The insulating region surrounds the active path. The first terminal and the second terminal are respectively disposed on two ends of the active path.

BRIEF DESCRIPTION OF THE DRAWINGS

FIG. 58B is a cross-sectional view taking along line 58-5B of FIG. 5A;

DETAILED DESCRIPTION

Figure 1:
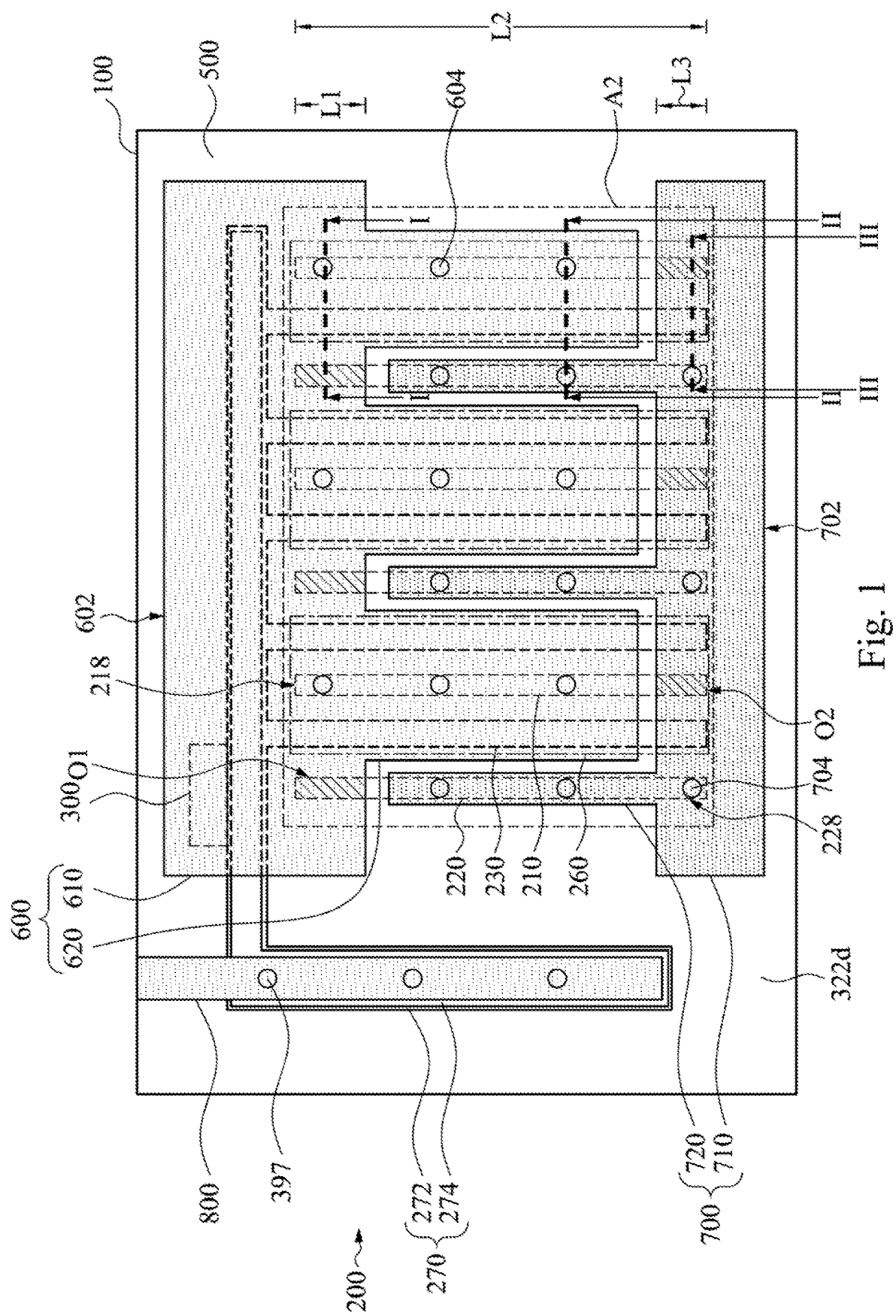
FIG. 1 is a top view of a semiconductor device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
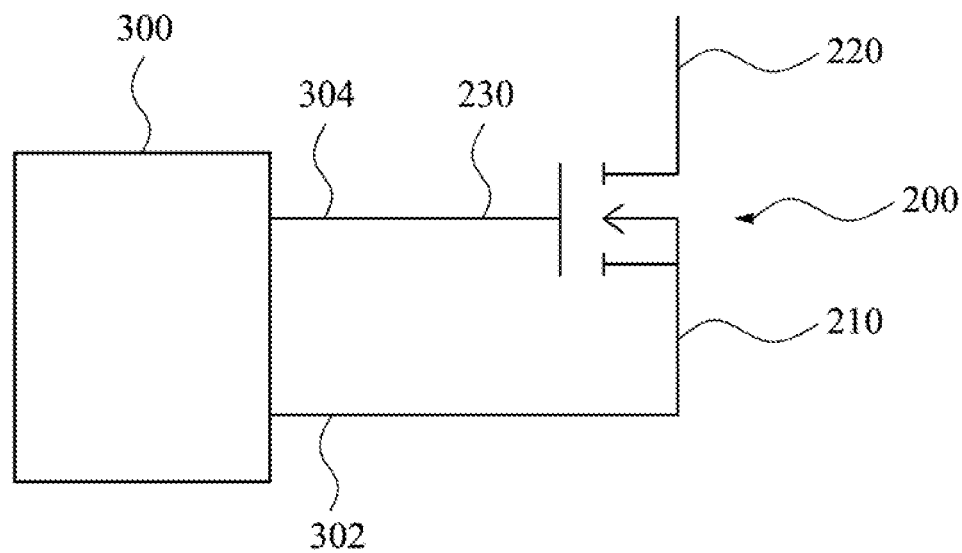
FIG. 2 is a circuit diagram the semiconductor device of FIG. 1.

FIG. 1 is a top view of a semiconductor device according to some embodiments of the present disclosure, and FIG. 2 is a circuit diagram the semiconductor device of FIG. 1. In FIGS. 1 and 2, the semiconductor device includes a substrate 100, a power device 200, a protection circuit 300, a dielectric layer 500, a source pad 600, a drain pad 700, and a gate pad 800. The power device 200 is disposed on the substrate 100. The power device 200 includes at least one source electrode 210, at least one drain electrode 220, and at least one gate electrode 230. For example, in FIG. 1, the power device 200 includes three source electrodes 210, three drain electrodes 220, and five gate electrodes 230. The protection circuit 300 is disposed on the substrate 100 and has a first terminal 302 and a second terminal 304. The dielectric layer 500 is disposed on the power device 200 and protection circuit 300. The source pad 600 is disposed on the dielectric layer 500 and is electrically connected with the source electrodes 210 of the power device 200 and the first terminal 302 of the protection circuit 300. The drain pad 700 is disposed on the dielectric layer 500 and is electrically connected with the drain electrodes 220 of the power device 200. The gate pad 800 is disposed on the dielectric layer 500 and is electrically connected with the gate electrodes 230 of the power device 200 and the second terminal 304 of the protection circuit 300. At least part of the protection circuit 300 is disposed under the gate pad 800, the source pad 600, or the drain pad 700. In other words, the gate pad 800, the source pad 600, or the drain pad 700 covers at least part of the protection circuits 300. Or, a projection of the protection circuit 300 on the dielectric layer 500 overlaps one of projections of the gate pad 800, the source pad 600, and the drain pad 700 on the dielectric layer 500. For example, in FIG. 1, the protection circuit 300 is disposed under the source pad 600.

The protection circuit 300 can be an electrostatic discharge (ESD) protection circuit. The protection circuit 300 is connected with the power device 200 to prevent a user from being shocked by the static electricity of the power device 200. Moreover, since at least part of the protection circuit 300 is disposed under the gate pad 800, the source pad 600, or the drain pad 700, the semiconductor device of this embodiment does not waste the layout area thereof and thus maintains a small layout area.

Figure 3:
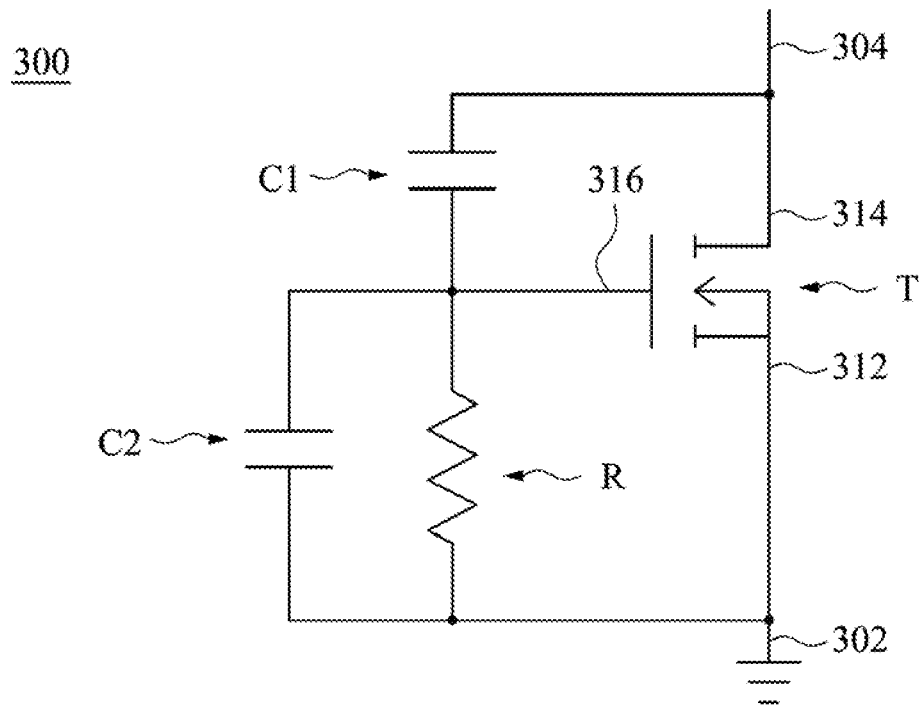
FIG. 3 is a circuit diagram the protection circuit of FIG. 1 according to some embodiments.

FIG. 3 is a circuit diagram the protection circuit 300 of FIG. 1 according to some embodiments. In FIG. 3, the protection circuit 300 includes a protection active device T, a resistor R, a first capacitor C1, and a second capacitor C2. The protection active device T includes a source electrode 312, a drain electrode 314, and a gate electrode 316. The source electrode 312 of the protection active device T is electrically connected with the first terminal 302 of the protection circuit 300, and the drain electrode 314 of the protection active device T is electrically connected with the second terminal 304 of the protection circuit 300. The first capacitor C1 is electrically connected between the drain electrode 314 and the gate electrode 316 of the protection active device T. The second capacitor C2 is electrically connected between the source electrode 312 and the gate electrode 316 of the protection active device T. The resistor R is electrically connected between the source electrode 312 and the gate electrode 316 of the protection active device T. In some embodiments, the first terminal 302 of the protection circuit 300 can be in electrical communication with a ground.

Figure 4A:
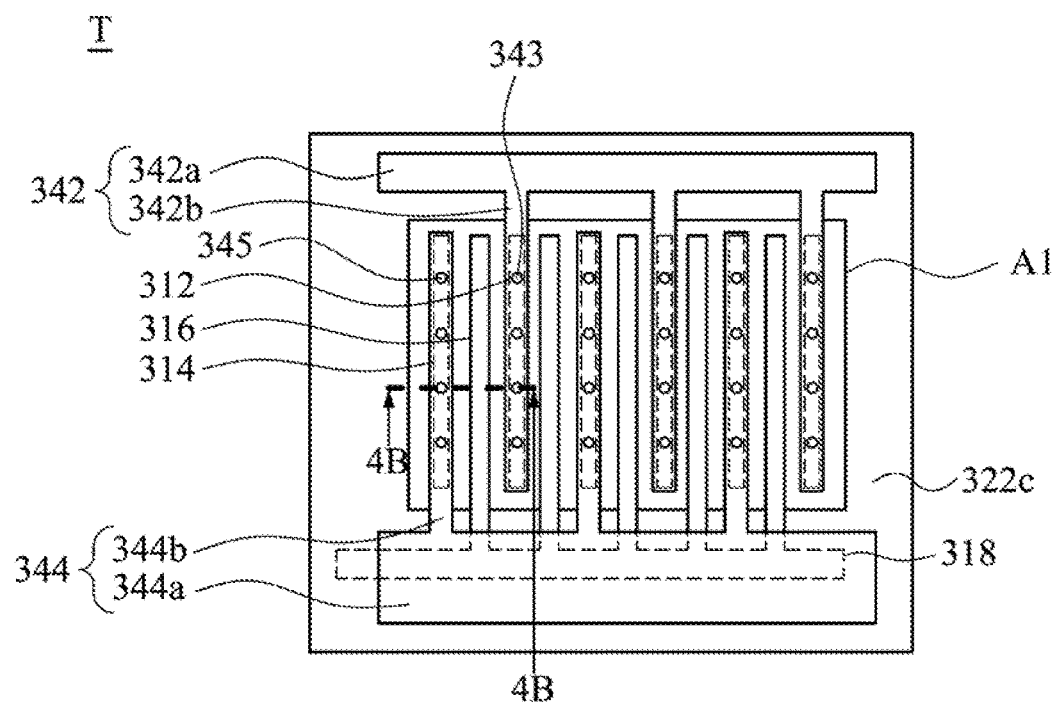
FIG. 4A is a top view of the protection active device of FIG. 3 according to some embodiments.
Figure 4B:
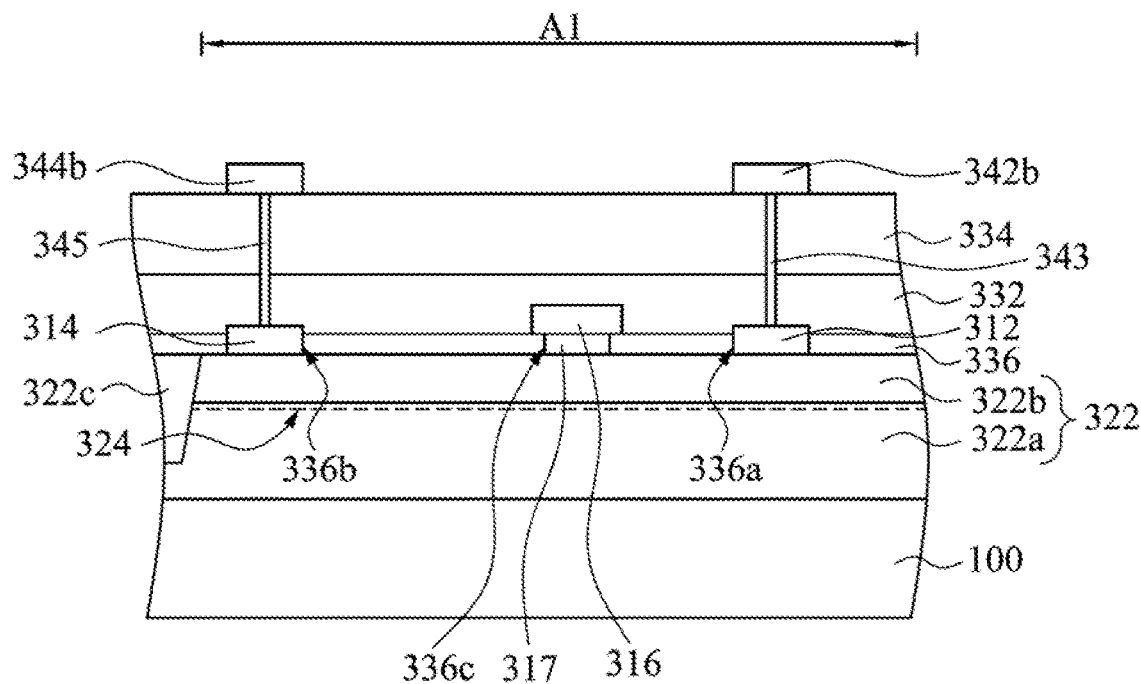
FIG. 4B is a cross-sectional view taking along line 4B-4B of FIG. 4A.

FIG. 4A is a top view of the protection active device T of FIG. 3 according to some embodiments, and FIG. 4B is a cross-sectional view taking along line 4B-4B of FIG. 4A. In FIGS. 4A and 4B, the protection active device T includes an active layer 322, a plurality of the source electrodes 312, a plurality of drain electrodes 314, a plurality of gate electrodes 316, and a gate bus bar 318. The active layer 322 is disposed on the substrate 100 and includes an active region A1. The source electrodes 312, the drain electrodes 314, and the gate electrodes 316 are disposed on the active region A1 of the active layer 322. The source electrodes 312 and the drain electrodes 314 are alternately arranged, and the gate electrodes 316 are respectively disposed between the adjacent source electrodes 312 and the drain electrodes 314. The gate bus bar 318 is electrically connected with the gate electrodes 316. In some embodiments, the gate bus bar 318 and the gate electrodes 316 are integrally formed. In some embodiments, the source electrodes 312 and drain electrode 314 are ohmic contacts.

In some embodiments, the active layer 322 includes a channel layer 322a and a barrier layer 322b disposed on the channel layer 322a. A two-dimensional electron gas (2DEG) channel 324 is formed between the channel layer 322a and the barrier layer 322b and in the active region A1. The barrier layer 322b may be a layer that induces the 2DEG channel 324 in the channel layer 322a. The 2DEG channel 324 may be formed in a region of the channel layer 322a adjacent to an interface between the channel layer 322a and the barrier layer 322b. In some embodiments, the channel layer 322a can be made of GaN, and the barrier layer 322b can be made of AlGaN. The active layer 322 further includes an insulating region 322c adjacent to the active region A1 to define the shape of the active region A1. For example, in FIG. 4A, the insulating region 322c surrounds the active region A1. The insulating region 322c may be formed by implanting ions, such as oxygen, nitrogen, carbon, or the like, into the active layer 322. In some other embodiments, the insulating region 322c is a shallow trench isolation (STI).

The protection active device T further includes at least one dielectric layer disposed on the source electrodes 312, the drain electrode 314, the gate electrodes 316, and the gate bus bar 318. For example, in FIG. 4B, two dielectric layers 332 and 334 are disposed on the source electrodes 312, the drain electrode 314, the gate electrodes 316, and the gate bus bar 318. The protection active device T further includes a p-type layer 317 disposed between the gate electrode 316 and the active layer 322. Therefore, the protection active device T is an enhancement mode transistor. In some other embodiments, however, the protection active device T can be a depletion mode transistor, and the present disclosure is not limited in this respect. Moreover, the protection active device T further includes a dielectric layer 336 disposed between the dielectric layer 332 and the active layer 322. In FIG. 4B, the dielectric layer 336 has a plurality of openings 336a, 336b, and 336c. The source electrode 312 is disposed in the opening 336a, the drain electrode 314 is disposed in the opening 336b, and the p-type layer 317 is disposed in the opening 336c.

The protection active device T further includes a source metal layer 342, a drain metal layer 344, at least one source plug 343, and at least one drain plug 345. For example, the protection active device T includes a plurality of source plugs 343 and drain plugs 345 in FIG. 4A. The source metal layer 342 and the drain metal layer 344 are disposed on the dielectric layers 332 and 334. The source metal layer 342 includes a body portion 342a and at least one branch portion 342b. For example, the source metal layer 342 has a plurality of branch portions 342b in FIG. 4A. The branch portions 342b of the source metal layer 342 are respectively disposed on the source electrodes 312, and the body portion 342a of the source metal layer 342 is connected with the branch portions 342b. In some embodiments, the body portion 342a and the branch portions 342b are integrally formed. The source plugs 343 are disposed in the dielectric layers 332 and 334 and between the source electrodes 312 and the branch portions 342b of the source metal layer 342 to interconnect the source electrodes 312 and the source metal layer 342. The drain metal layer 344 includes a body portion 344a and at least one branch portion 344b. For example, the drain metal layer 344 has a plurality of branch portions 344b in FIG. 4A. The branch portions 344b of the drain metal layer 344 are respectively disposed on the drain electrodes 314, and the body portion 344a of the drain metal layer 344 is disposed on the gate bus bar 318 and is connected with the branch portions 344b. In some embodiments, the body portion 344a and the branch portions 344b are integrally formed. The drain plugs 345 are disposed in the dielectric layers 332 and 334 and between the drain electrodes 314 and the branch portions 344b of the drain metal layer 344 to interconnect the drain electrodes 314 and the drain metal layer 344. It is noted that the structure of the protection active device T in FIGS. 4A and 4B are illustrative, and should not limit the present disclosure. In some other embodiments, the protection active device T of FIG. 3 has other structures.

Figure 5A:
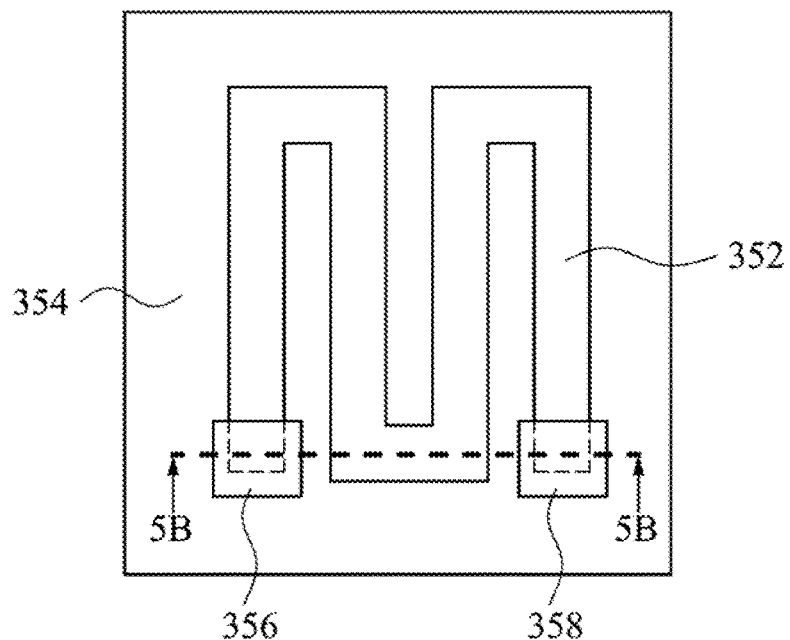
FIG. 5A is a top view of the resistor in FIG. 3 according to some embodiments.
Figure 5B:
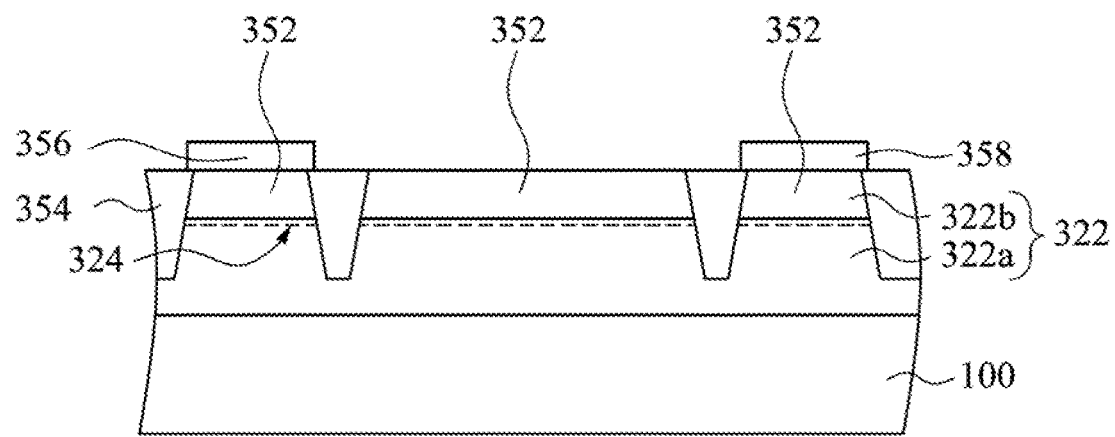

FIG. 5A is a top view of the resistor R in FIG. 3 according to some embodiments, and FIG. 58 is a cross-sectional view taking along line 5B-5B of FIG. 5A. In FIGS. 5A and 58B, the resistor R includes an active path 352, an insulating region 354, a first terminal 356, and a second terminal 358. The insulating region 354 can have the same structure and material as the insulating region 322c of FIGS. 4A and 4B. The first terminal 356 and the second terminal 358 are respectively disposed on opposite ends of the active path 352. In some embodiments, the active path 352 is formed in the active layer 322 and includes 2DEG channel 324, and the insulating region 354 surrounds the active path 352 to define the shape of the active path 352. The resistance of the resistor R is determined by the length of the active path 352. That is, the resistance of the resistor R increases as the length of the active path 352 increases. The first terminal 356 and the second terminal 358 are disposed on the active layer 322, and can be ohmic contacts. It is noted that the structure of the resistor R in FIGS. 5A and 5B are illustrative, and should not limit the present disclosure. In some other embodiments, the resistor R of FIG. 3 has other structures.

Figure 6A:
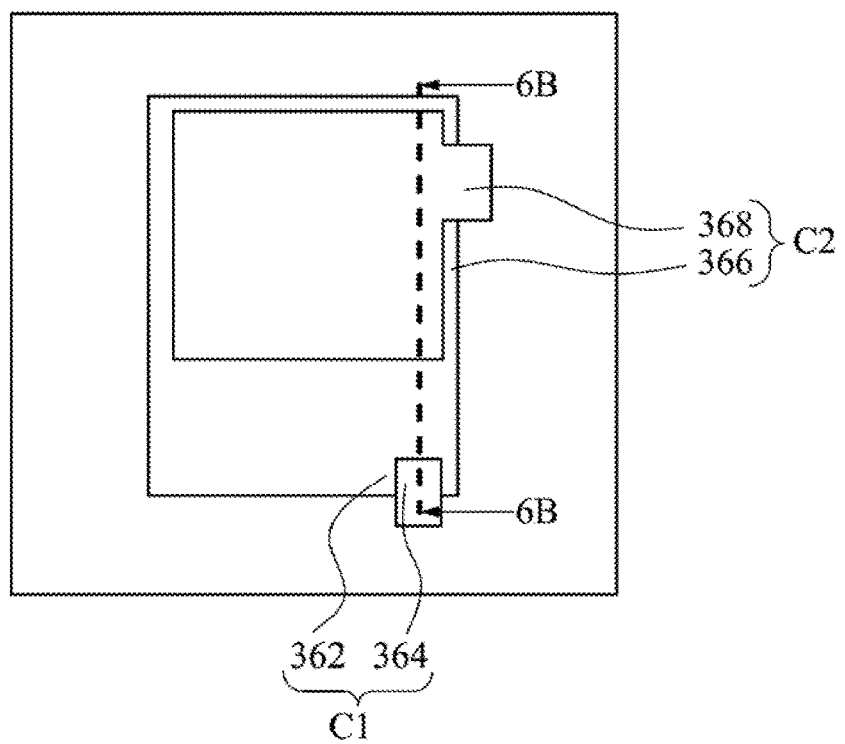
FIG. 6A is a top view of the first capacitor and the second capacitor in FIG. 3 according to some embodiments.
Figure 6B:
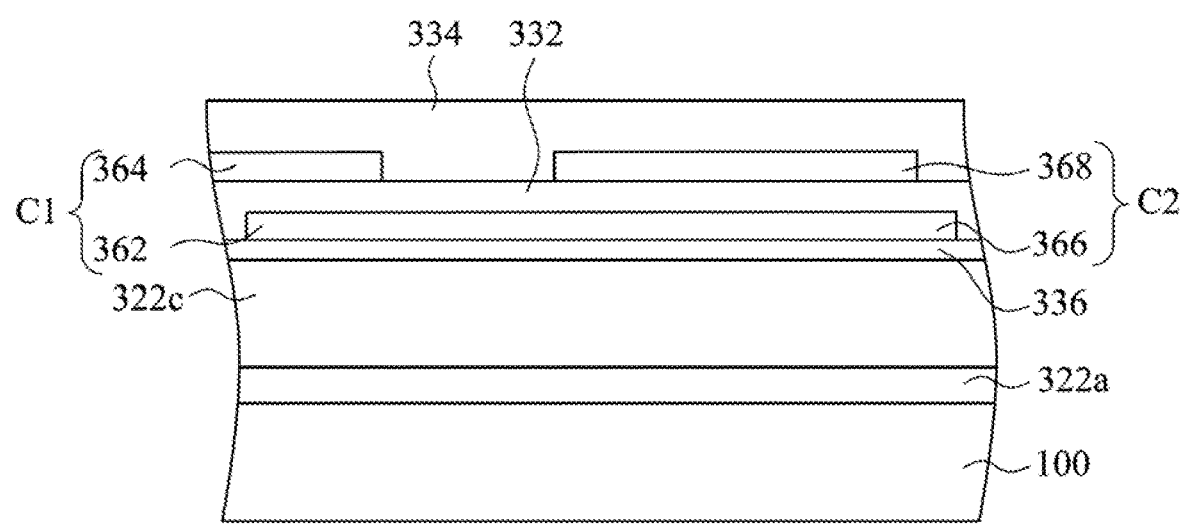
FIG. 6B is a cross-sectional view taking along line 68-6B of FIG. 6A.

FIG. 6A is a top view of the first capacitor C1 and the second capacitor C2 in FIG. 3 according to some embodiments, and FIG. 6B is a cross-sectional view taking along line 6B-6B of FIG. 6A. In FIGS. 6A and 6B, the first capacitor C1 includes a bottom electrode 362 and a top electrode 364. The bottom electrode 362 is disposed between the dielectric layer 336 and the dielectric layer 332, and the top electrode 364 is disposed between the dielectric layers 332 and 334. The bottom electrode 362 overlaps the top electrode 364 to form the first capacitor C1. Furthermore, the second capacitor C2 includes a bottom electrode 366 and a top electrode 368. The bottom electrode 366 is disposed between the dielectric layer 336 and the dielectric layer 332, and the top electrode 368 is disposed between the dielectric layers 332 and 334. The bottom electrode 366 overlaps the top electrode 368 to form the second capacitor C2. In some embodiments, the bottom electrode 362 of the first capacitor C1 and the bottom electrode 366 of the second capacitor C2 are integrally formed, and the present disclosure is not limited in this respect. Moreover, it is noted that the structure of the first capacitor C1 and the second capacitor C2 in FIGS. 6A and 6B are illustrative, and should not limit the present disclosure. In some other embodiments, the first capacitor C1 and the second capacitor C2 of FIG. 3 have other structures.

Figure 7A:
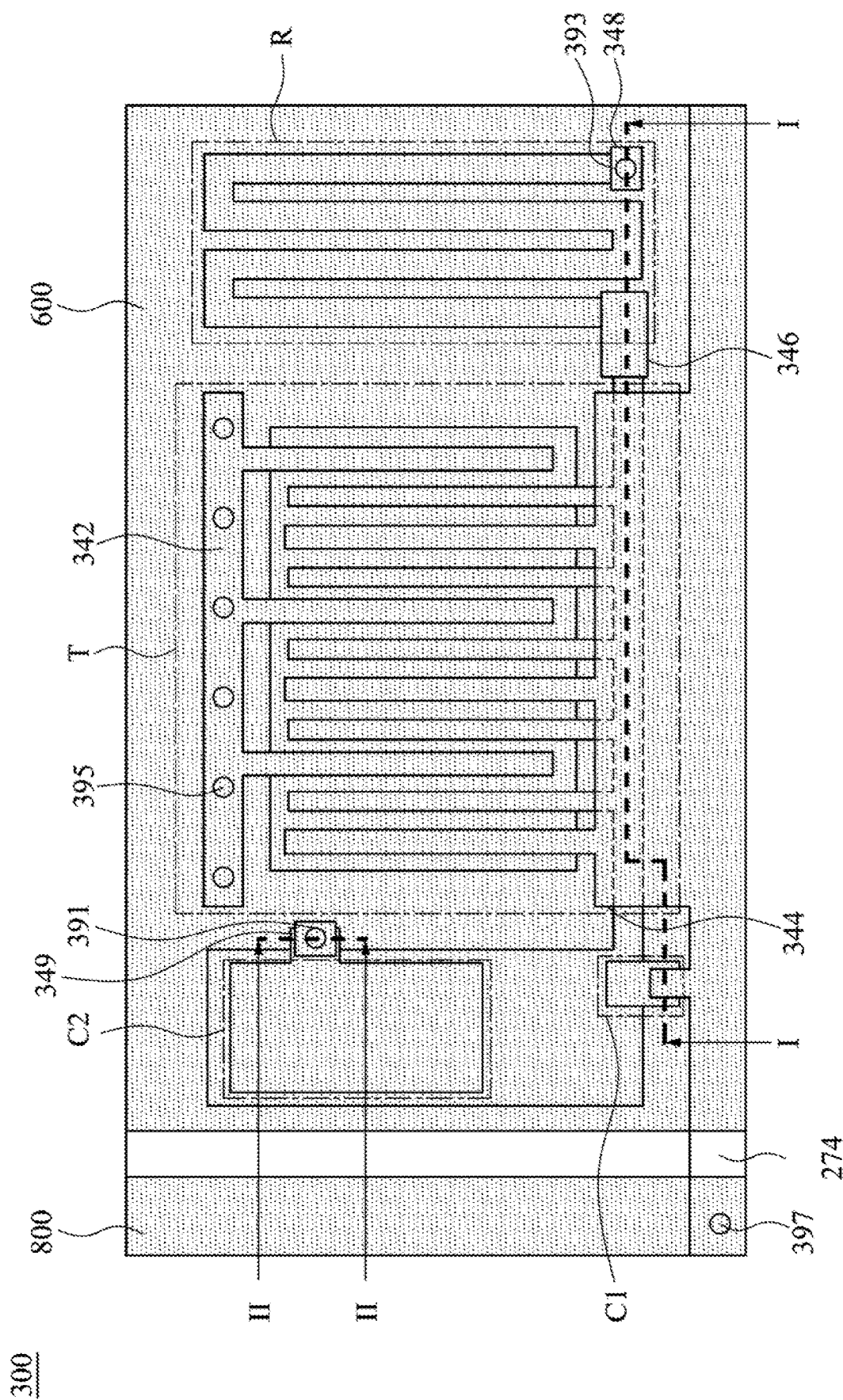
FIG. 7A is a top view of the protection circuit of FIG. 3, the source pad, and the gate pad of FIG. 1 according to some embodiments.
Figure 7B:
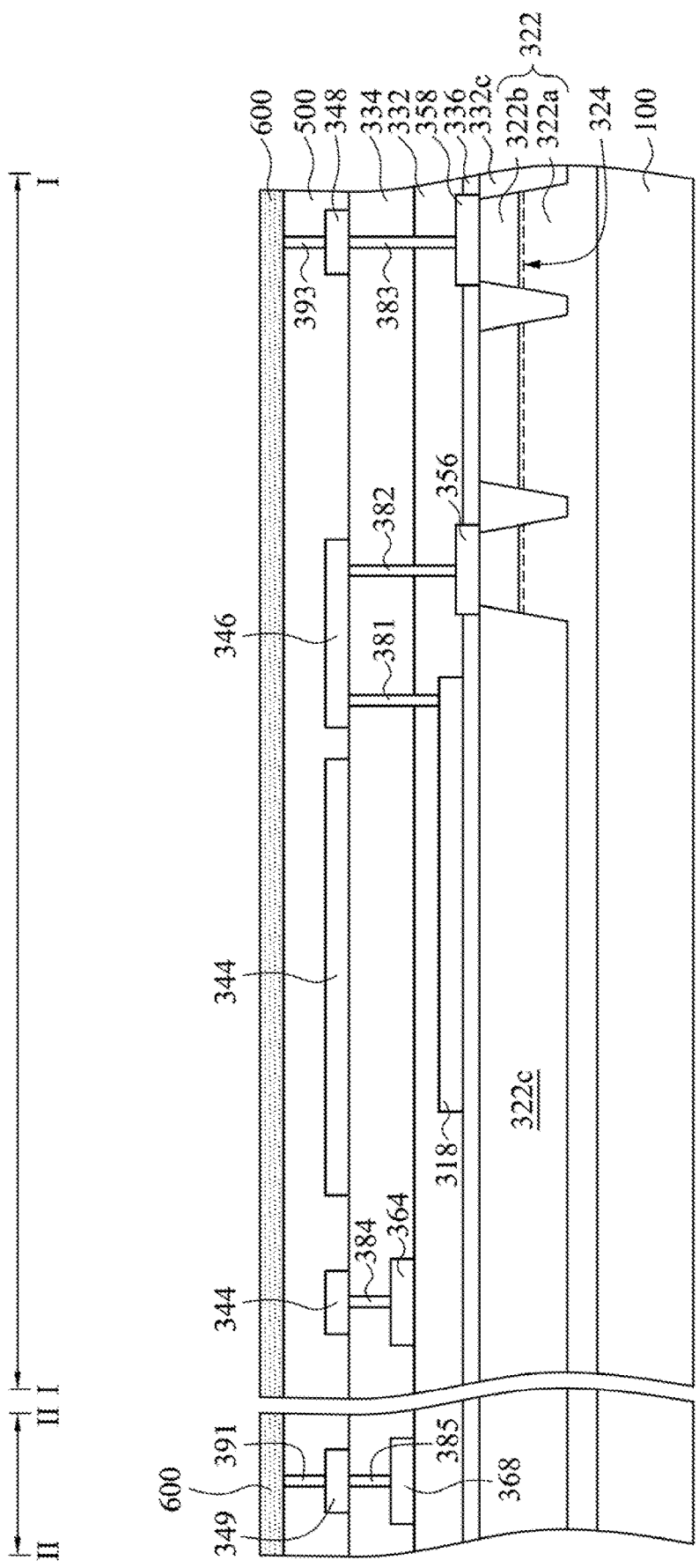
FIG. 7B is a cross-sectional view taking along lines I-I and II-II of FIG. 7A.

FIG. 7A is a top view of the protection circuit 300 of FIG. 3, the source pad 600, and the gate pad 800 of FIG. 1 according to some embodiments, and FIG. 7B is a cross-sectional view taking along lines I-I and II-II of FIG. 7A. The protection active device T is electrically connected with the resistor R. In greater detail, the gate of the protection active device T is electrically connected with the first terminal 356 of the resistor R. A connector 346 is disposed on the dielectric layers 332 and 334. A plug 381 is disposed in the dielectric layer 332 and 334 and between the connector 346 and the gate bus bar 318 of the protection active device T, and a plug 382 is disposed in the dielectric layer 332 and 334 and between the connector 346 and the first terminal 356 of the resistor R. Therefore, the gate of the protection active device T is electrically connected with the first terminal 356 of the resistor R through the plug 381, the connector 346, and the plug 382. In FIG. 7B, the gate bus bar 318 is disposed between the dielectric layers 336 and 332. Furthermore, the source of the protection active device T is electrically connected with the second terminal 358 of the resistor R. For example, the dielectric layer 500 is disposed on the dielectric layer 334 and covers the connector 346 and the source metal layer 342, and the source pad 600 is disposed on the dielectric layer 500. At least one via 395 is disposed in the dielectric layer 500 and between the source pad 600 and the source metal layer 342 to interconnect the source pad 600 and the source metal layer 342. In this embodiment, the source pad 600 can be the first terminal 302 (see FIG. 2) of the protection circuit 300. Furthermore, a metal layer 348 is disposed between the dielectric layers 334 and 500, a plug 383 is disposed in the dielectric layers 332 and 334 and between the metal layer 348 and the second terminal 358, and a via 393 is disposed in the dielectric layer 500 and between the source pad 600 and the metal layer 348. Therefore, the second terminal 358 of the resistor R is electrically connected with the source pad 600 through the plug 383, the metal layer 348, and the via 393, and thus, both of the source of the protection active device T and the second terminal 358 of the resistor R are electrically connected with the source pad 600.

The protection active device T is electrically connected with the first capacitor C1. In greater detail, the gate of the protection active device T is electrically connected with the bottom electrode 362 (see FIG. 6A) of the first capacitor C1. For example, the gate bus bar 318 of the protection active device T and the bottom electrode 362 of the first capacitor C1 are integrally formed as shown in FIG. 7A. The drain of the protection active device T is electrically connected with the top electrode 364 of the first capacitor C1. For example, a plug 384 is disposed between the drain metal layer 344 and the top electrode 364 of the first capacitor C1 to interconnect the drain metal layer 344 and the top electrode 364. Furthermore, the drain metal layer 344 is further electrically connected with the gate pad 800, which is disposed on the dielectric layer 500 and serves as the second terminal 304 (see FIG. 2) of the protection circuit 300, through a via 397 disposed in the dielectric layer 500 and between the gate pad 800 and the drain metal layer 344.

The protection active device T is electrically connected with the second capacitor C2. The gate of the protection active device T is electrically connected with the bottom electrode 366 (see FIG. 6A) of the second capacitor C2. For example, the gate bus bar 318 of the protection active device T, the bottom electrode 362 of the first capacitor C1, and the bottom electrode 366 of the second capacitor C2 are integrally formed as shown in FIG. 7A. The source of the protection active device T is electrically connected with the top electrode 368 of the second capacitor C2. For example, a metal layer 349 is disposed between the dielectric layers 334 and 500, a plug 385 is disposed between the metal layer 349 and the top electrode 368 of the second capacitor C2 to interconnect the metal layer 349 and the top electrode 368, and a via 391 is disposed between the source pad 600 and the metal layer 349 to interconnect the source pad 600 and the metal layer 349. Therefore, the top electrode 368 of the second capacitor C2 is electrically connected with the source metal layer 342 through the plug 385, the metal layer 349, the via 391, the source pad 600, and the via 395. It is noted that the interconnection configuration of the protection circuit 300 in FIGS. 7A and 7B is illustrative, and should not limit the claimed scope.

Figure 8:
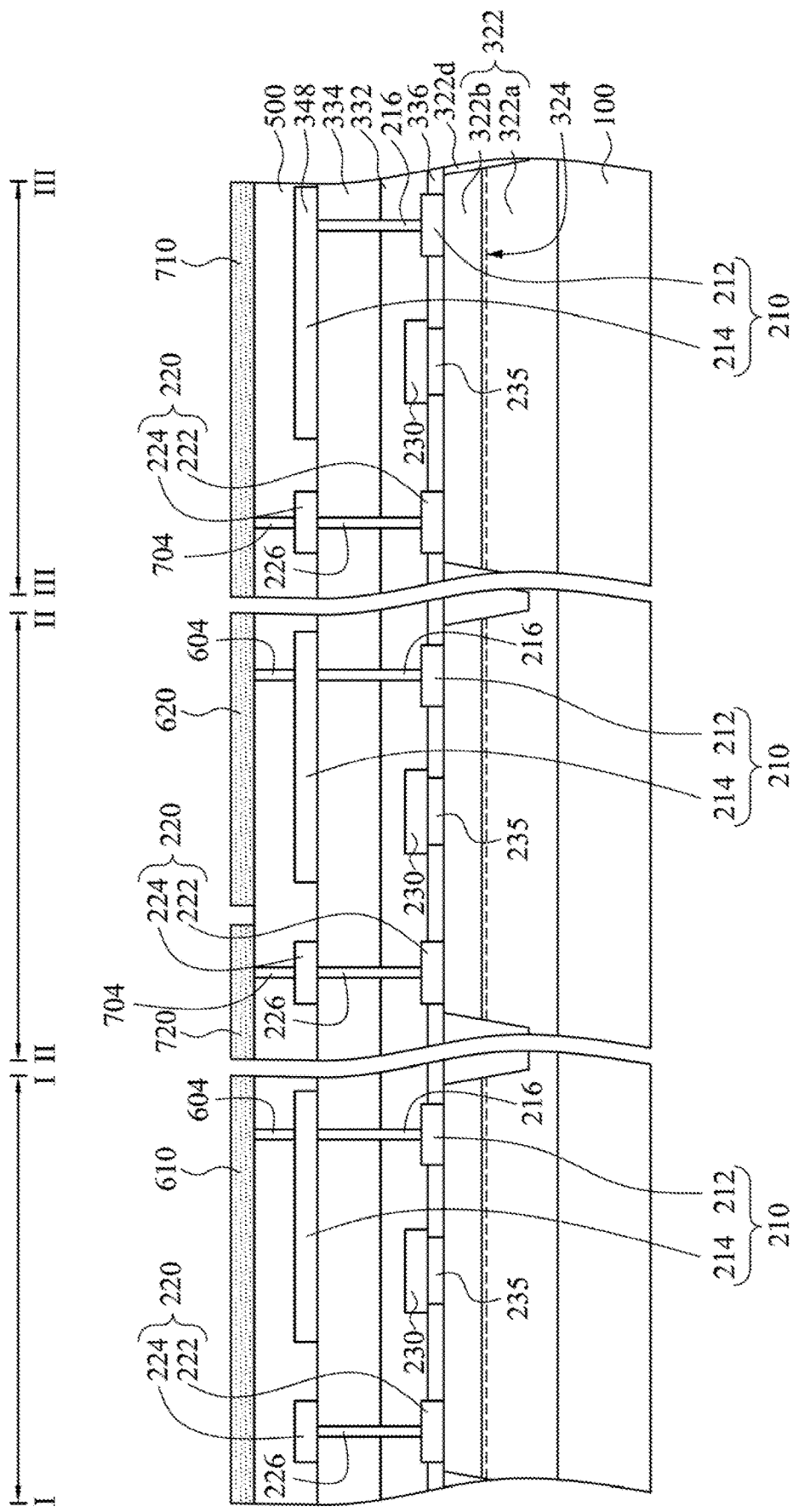
FIG. 8 is a cross-sectional view taking along lines I-I, II-II, and III-III of FIG. 1.

FIG. 8 is a cross-sectional view taking along lines I-I, II-II, and II-III of FIG. 1. Reference is made to FIGS. 1 and 8. The power device 200 includes the source electrodes 210, the drain electrodes 220, the gate electrodes 230, and a gate bus bar 270. The source electrodes 210, the drain electrodes 220, the gate electrodes 230, and the gate bus bar 270 are disposed on the active layer 322. The active layer 322 further includes an active region A2 and the insulating region 322d. The insulating region 322d surrounds the active region A2 to define the shape of the active region A2, and the insulating region 322d may have the similar materials to the insulating region 322c in FIGS. 4A and 4B. The source electrodes 210, the drain electrodes 220, and the gate electrodes 230 are disposed on the active region A2, and the gate bus bar 270 is disposed on the insulating region 322d and between the dielectric layers 332 and 336. The source electrodes 210 and the drain electrodes 220 are alternately arranged, and the gate electrodes 230 are respectively disposed between the adjacent source electrodes 210 and the drain electrodes 220. In some embodiments, the power device 200 further includes a p-type layer 235 disposed between the gate electrode 230 and the active layer 322. The p-type layer 235 can be made of p-type material, such as p-GaN or other suitable materials. Therefore, the power device 200 of FIG. 8 is an enhancement mode transistor. In some other embodiments, however, the power device 200 can be a depletion mode transistor, and the present disclosure is not limited in this respect.

At least one of the source electrodes 210 includes a bottom source portion 212 and a top source portion 214. The bottom source portion 212 is disposed between the active layer 322 and the dielectric layer 332, and the top source portion 214 is disposed between the dielectric layers 334 and 500. At least one plug 216 is disposed in the dielectric layers 332 and 334 and between the bottom source portion 212 and the top source portion 214 to interconnect the bottom source portion 212 and the top source portion 214. The top source portions 214 are disposed on the gate electrodes 230 but are isolated from the gate electrodes 230.

At least one of the drain electrodes 220 includes a bottom drain portion 222 and a top drain portion 224. The bottom drain portion 222 is disposed between the active layer 322 and the dielectric layer 332, and the top drain portion 224 is disposed between the dielectric layers 334 and 500. At least one plug 226 is disposed in the dielectric layers 332 and 334 and between the bottom drain portion 222 and the top drain portion 224 to interconnect the bottom drain portion 222 and the top drain portion 224.

The gate electrodes 230 are electrically connected with the gate bus bar 270. In greater detail, the gate bus bar 270 includes a bottom gate portion 272 and a top gate portion 274. The bottom gate portion 272 is disposed between the dielectric layers 332 and 336, and the top gate portion 274 is disposed between the dielectric layers 334 and 500. The gate electrodes 230 are connected with the bottom gate portion 272. In some embodiments, the gate electrodes 230 and the bottom gate portion 272 are integrally formed. At least one plug is disposed in the dielectric layers 332 and 334 and between the bottom gate portion 272 and the top gate portion 274 to interconnect the bottom gate portion 272 and the top gate portion 274. In the embodiment of FIG. 7A, the top gate portion 274 of the gate bus bar 270 of the power device 200 is connected to the drain metal layer 344 of the protection circuit 300 (see FIG. 7A), such that the gate of the power device 200 is electrically connected with the drain of the protection circuit 300.

The gate pad 800 is disposed on the dielectric layer 500 and the top gate portion 274 of the gate bus bar 270. At least one via 397 is disposed in the dielectric layer 500 and between the top gate portion 274 and the gate pad 800 to interconnect the top gate portion 274 and the gate pad 800. In the embodiment of FIG. 7A, the gate pad 800 is the second terminal 304 (see FIG. 2) of the protection circuit 300.

The source pad 600 is disposed on the dielectric layer 500 and includes a body portion 610 and at least one branch portion 620. For example, the source pad 600 includes three branch portions 620 in FIG. 1. The body portion 610 covers the protection circuit 300. The branch portions 620 are disposed on the top source portion 214 and connected to the body portion 610. At least one plug 604 is disposed in the dielectric layer 500 and between the source pad 600 and the top source portion 214 to interconnect the source pad 600 and the top source portion 214. In the embodiment of FIG. 7A, the source pad 600 is the first terminal 302 of the protection circuit 300.

The drain pad 700 is disposed on the dielectric layer 500 and includes a body portion 710 and at least one branch portion 720. For example, the drain pad 700 includes three branch portions 720 in FIG. 1. The branch portions 720 are disposed on the top drain portion 224 of the drain electrodes 220 and connected to the body portion 710. At least one plug 704 is disposed in the dielectric layer 500 and between the drain pad 700 and the top drain portion 224 to interconnect the drain pad 700 and the top drain portion 224.

In FIG. 1, a projection of the source pad 600 on the active layer 322 forms a source pad region 602, and a projection of the drain electrode 220 on the active layer 322 forms a drain region 228. The source pad region 602 overlaps at least a portion of the drain region 228, and an area of an overlapping region O1 between the source pad region 602 and the drain region 228 is smaller than or equal to 40% of an area of the drain region 228. For example, in FIG. 1, the overlapping region O1 has a length L1 and the drain electrode 220 has a length L2, and the length L1 is less than or equal to 40% of the length L2.

A projection of the drain pad 700 on the active layer 322 forms a drain pad region 702, and a projection of the source electrode 210 on the active layer 322 forms a source region 218. The drain pad region 702 overlaps at least a portion of the source region 218, and an area of an overlapping region O2 between the drain pad region 702 and the source region 218 is smaller than or equal to 40% of an area of the source region 218. For example, in FIG. 1, the overlapping region O2 has a length L3 and the source electrode 210 has a length L2, and the length L3 is less than or equal to 40% of the length L2.

Figure 9A:
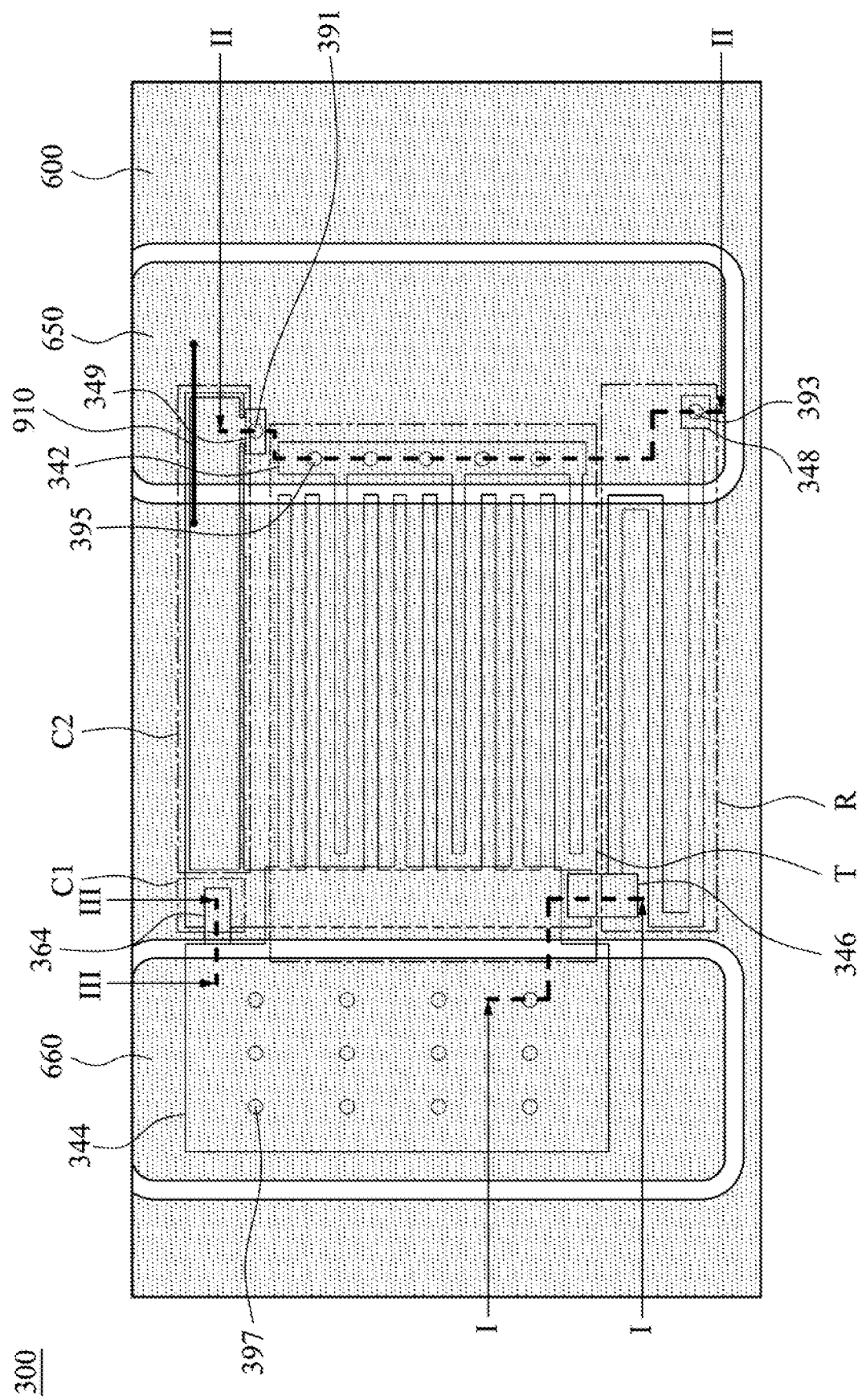
FIG. 9A is a top view of the protection circuit of FIG. 3 according to some other embodiments.
Figure 9B:
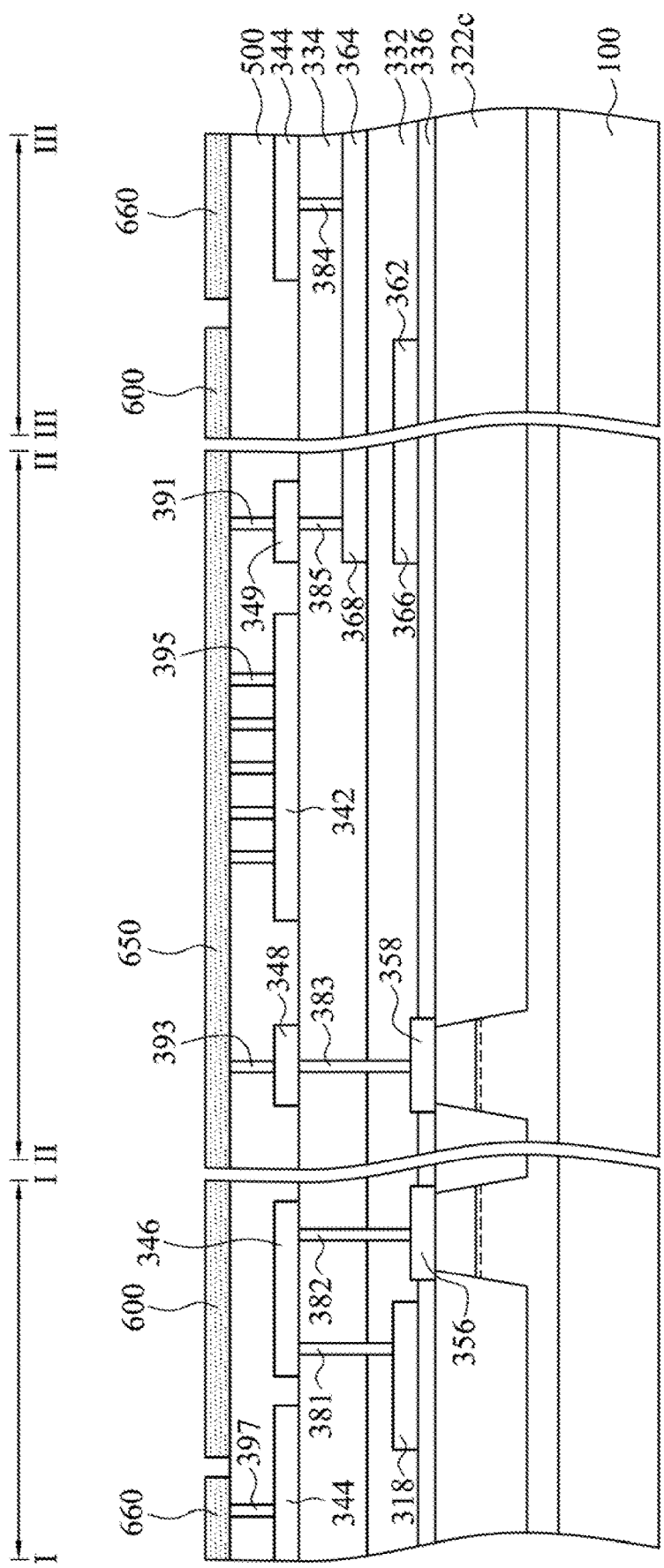
FIG. 9B is a cross-sectional view taking along lines I-I, II-II, and III-III of FIG. 9A.

FIG. 9A is a top view of the protection circuit 300 of FIG. 3 according to some other embodiments, and FIG. 9B is a cross-sectional view taking along lines I-I, II-II, and II-III of FIG. 9A. The protection active device T is electrically connected with the resistor R. In greater detail, the gate of the protection active device T is electrically connected with the first terminal 356 of the resistor R. A connector 346 is disposed on the dielectric layers 332 and 334. A plug 381 is disposed in the dielectric layer 332 and 334 and between the connector 346 and the gate bus bar 318 of the protection active device T, and a plug 382 is disposed in the dielectric layer 332 and 334 and between the connector 346 and the first terminal 356 of the resistor R. Therefore, the gate of the protection active device T is electrically connected with the first terminal 356 of the resistor R through the plug 381, the connector 346, and the plug 382. Furthermore, the source of the protection active device T is electrically connected with the second terminal 358 of the resistor R. For example, a first protection circuit pad 650 serving as the first terminal 302 (see FIG. 2) of the protection circuit 300 is disposed on the dielectric layer 500. At least one via 395 is disposed in the dielectric layer 500 and between the first protection circuit pad 650 and the source metal layer 342 to interconnect the first protection circuit pad 650 and the source metal layer 342. Furthermore, a metal layer 348 is disposed between the dielectric layers 334 and 500, a plug 383 is disposed in the dielectric layers 332 and 334 and between the metal layer 348 and the second terminal 358, and a via 393 is disposed in the dielectric layer 500 and between the first protection circuit pad 650 of the protection circuit 300 and the metal layer 348. Therefore, the second terminal 358 of the resistor R is electrically connected with the first protection circuit pad 650 through the plug 383, the metal layer 348, and the via 393, and thus, both of the source of the protection active device T and the second terminal 358 of the resistor R are electrically connected with the first protection circuit pad 650.

The protection active device T is electrically connected with the first capacitor C1. The gate of the protection active device T is electrically connected with the bottom electrode 362 of the first capacitor C1. For example, the gate bus bar 318 of the protection active device T and the bottom electrode 362 of the first capacitor C1 are integrally formed as shown in FIG. 9A. The drain of the protection active device T is electrically connected with the top electrode 364 of the first capacitor C1. For example, a plug 384 is disposed between the drain metal layer 344 and the top electrode 364 of the first capacitor C1 to interconnect the drain metal layer 344 and the top electrode 364. Furthermore, the drain metal layer 344 is further electrically connected with a second protection circuit pad 660, which is disposed on the dielectric layer 500 and serves as the second terminal 304 (FIG. 2) of the protection circuit 300, through a via 397 disposed in the dielectric layer 500 and between the second protection circuit pad 660 and the drain metal layer 344.

The protection active device T is electrically connected with the second capacitor C2. The gate of the protection active device T is electrically connected with the bottom electrode 366 of the second capacitor C2. For example, the gate bus bar 318 of the protection active device T, the bottom electrode 362 of the first capacitor C1, and the bottom electrode 366 of the second capacitor C2 are integrally formed as shown in FIG. 9A. The source of the protection active device T is electrically connected with the top electrode 368 of the second capacitor C2. For example, a metal layer 349 is disposed between the dielectric layers 334 and 500, a plug 385 is disposed between the metal layer 349 and the top electrode 368 of the second capacitor C2 to interconnect the metal layer 349 and the top electrode 368, and a via 391 is disposed between the first protection circuit pad 650 and the metal layer 349 to interconnect the first protection circuit pad 650 and the metal layer 349. Therefore, the top electrode 368 of the second capacitor C2 is electrically connected with the source metal layer 342 through the plug 385, the metal layer 349, the via 391, the first protection circuit pad 650, and the via 395.

Furthermore, the source pad 600 is disposed on the dielectric layer 500 and surrounds the first protection circuit pad 650 and the second protection circuit pad 660. For example, the source pad 600 is adjacent to three edges of the first protection circuit pad 650 and the second protection circuit pad 660, and at least part of the source pad 600 is disposed between the first protection circuit pad 650 and the second protection circuit pad 660. It is noted that the interconnection configuration of the protection circuit 300 in FIGS. 9A and 9B are illustrative, and should not limit the claimed scope.

In some embodiments, the first protection circuit pad 650, the second protection circuit pad 660, the source pad 600, and the gate pad 800 are electrically isolated from each other before the testing of the power device 200. Since an electrical signal is injected into the power device 200 during the test, and the electrical signal may go to the protection circuit 300 instead of the power device 200 if the power device 200 and the protection circuit 300 are electrically connected with each other and the testing may be failed. With the configuration of FIG. 9A, a current leakage problem can be prevented during the testing of the power device 200. After the testing, a wire 910 can interconnect the first protection circuit pad 650 and the source pad 600 to electrically interconnect the first terminal 302 of the protection circuit 300 and the source of the power device 200, and another wire (not shown) can interconnect the second protection circuit pad 660 and the gate pad 800 to electrically interconnect the second terminal 304 of the protection circuit 300 and the gate of the power device 200.

Figure 10A:
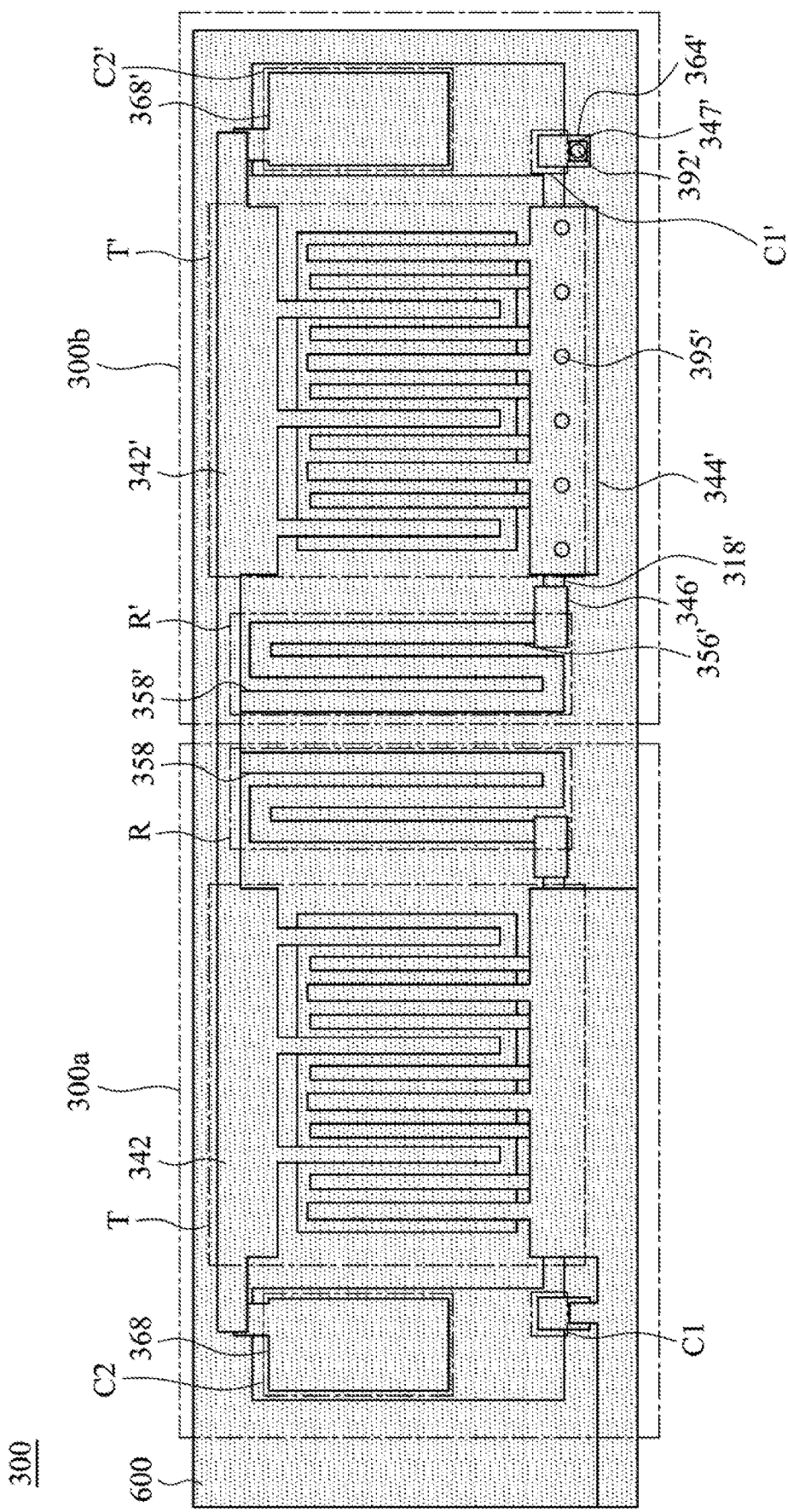
FIG. 10A is a top view of the protection circuit of FIG. 1 and the source pad of FIG. 1 according to some other embodiments.
Figure 10B:
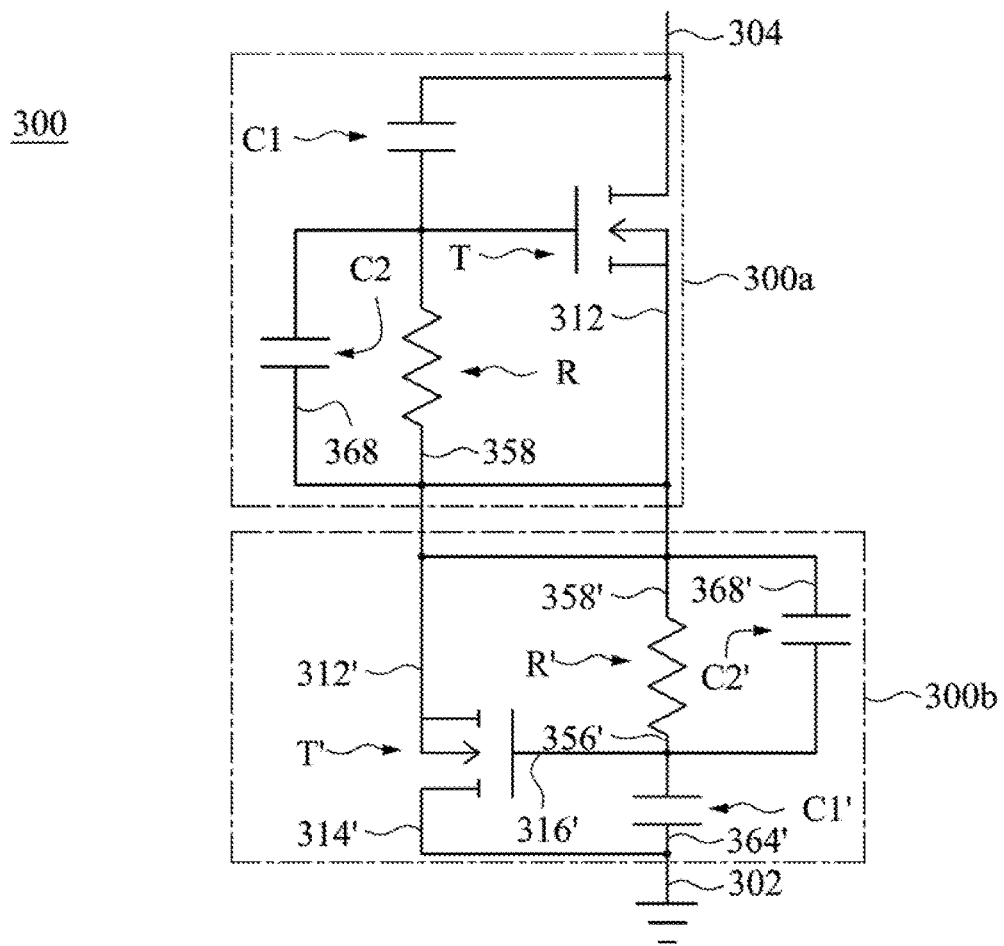
FIG. 10B is a circuit diagram of the protection circuit of FIG. 10A.

FIG. 10A is a top view of the protection circuit 300 of FIG. 3 and the source pad 600 of FIG. 1 according to some other embodiments, and FIG. 10B is a circuit diagram of the protection circuit 300 of FIG. 10A. In this embodiment, the protection circuit 300 includes a first circuit 300a and a second circuit 300b. The first circuit 300a has the similar configuration to the protection circuit 300 of FIG. 7A, and the second circuit 300b has a configuration substantially mirror symmetric to the first circuit 300a. In greater detail, the second circuit 300b includes a protection active device T', a resistor R', a first capacitor C1', and a second capacitor C2'. The source electrode 312 (and the source metal layer 342) of the protection active device T is electrically connected with the second terminal 358 of the resistor R, the top electrode 368 of the second capacitor C2, the second terminal 358' of the resistor R', the top electrode 368' of the second capacitor C2', and the source electrode 312' (and the source metal layer 342') of the protection active device T'. The first terminal 356' of the resistor R' is electrically connected with the gate electrode 316' (and the gate bus bar 318') of the protection active device T' through a connector 346'. A metal layer 347' is disposed on and electrically connected with the top electrode 364' of the first capacitor C1'. The drain electrode 314' (and the drain metal layer 344') of the protection active device T' is electrically connected to the top electrode 364' of first capacitor C1' and the first terminal 302 of the protection circuit 300. For example, the metal layer 347' is electrically connected to the first terminal 302 through a via 392', and the drain metal layer 344' is electrically connected to the first terminal 302 through a via 395'. Other relevant structural details of the second circuit 300b are similar to that of the first circuit 300a, and other relevant structural details of the first circuit 300a are similar to that of the protection circuit 300 of FIGS. 7A and 7B, and, therefore, a description in this regard will not be repeated hereinafter.

Figure 11:
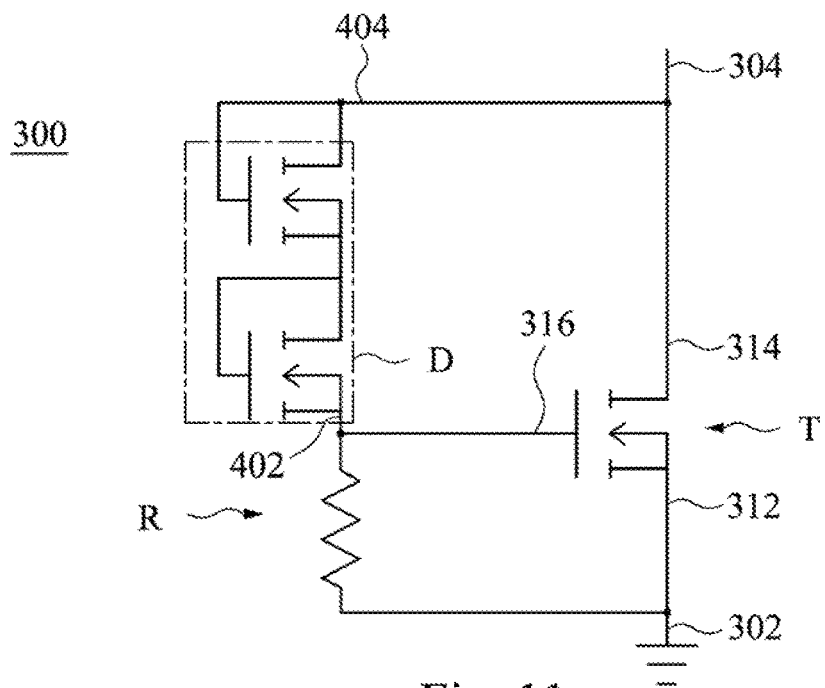
FIG. 11 is a circuit diagram the protection circuit of FIG. 1 according to some other embodiments.

FIG. 11 is a circuit diagram the protection circuit 300 of FIG. 1 according to some other embodiments. In FIG. 11, the protection circuit 300 includes a protection active device T, a resistor R, and a diode D. The protection active device T includes a source electrode 312, a drain electrode 314, and a gate electrode 316. The source electrode 312 of the protection active device T is electrically connected with the first terminal 302 of the protection circuit 300, and the drain electrode 314 of the protection active device T is electrically connected with the second terminal 304 of the protection circuit 300. The resistor R is electrically connected between the source electrode 312 and the gate electrode 316 of the protection active device T. The diode D is electrically connected between the drain electrode 314 and the gate electrode 316 of the protection active device T. In some embodiments, the first terminal 302 of the protection circuit 300 can be in electrical communication with a ground.

Figure 12A:
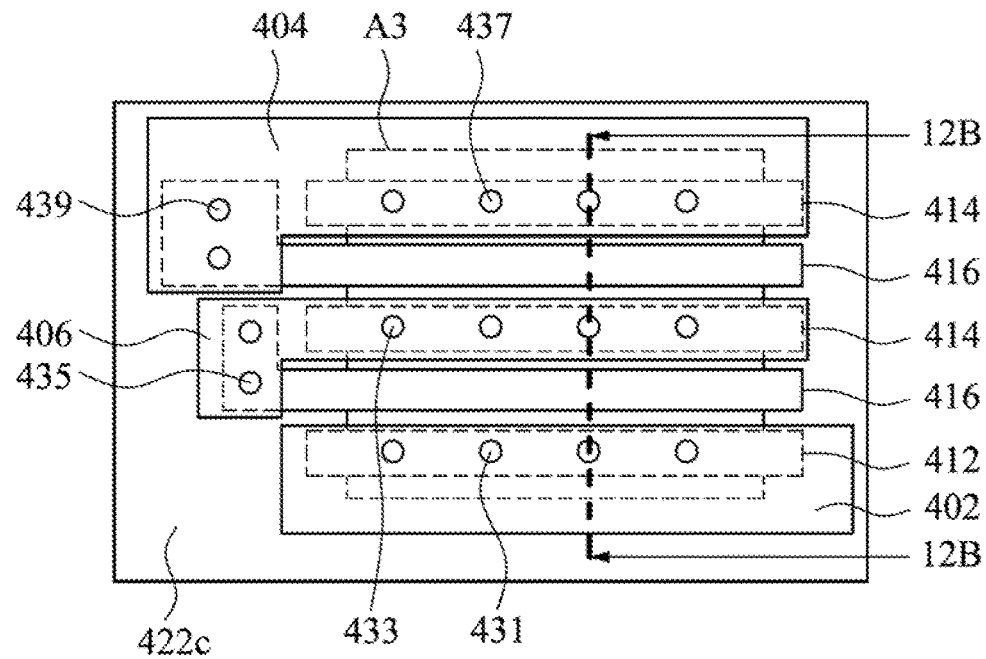
FIG. 12A is a top view of the diode of FIG. 11 according to some embodiments.
Figure 12B:
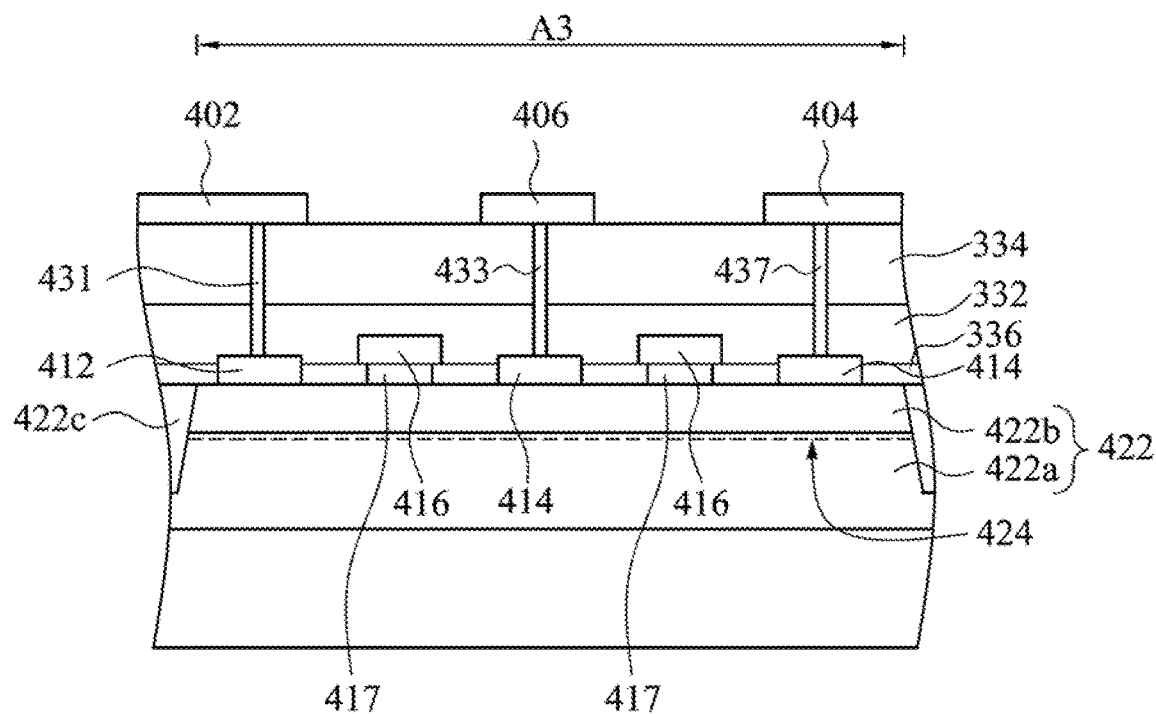
FIG. 12B is a cross-sectional view taking along line 12B-12B of FIG. 12A.

FIG. 12A is a top view of the diode D of FIG. 11 according to some embodiments, and FIG. 12B is a cross-sectional view taking along line 12B-12B of FIG. 12A. In FIGS. 12A and 12B, the diode D includes an active layer 422, a first terminal 402, a second terminal 404, at least one connector 406, a source electrode 412, a plurality of drain electrodes 414, and a plurality of gate electrodes 416. The active layer 422 is disposed on the substrate 100 and includes an active region A3. The source electrode 412, the drain electrodes 414, and the gate electrodes 416 are disposed on the active region A3 of the active layer 422. The drain electrodes 414 and the gate electrodes 416 are alternately arranged, and one of the gate electrodes 416 is disposed between the adjacent source electrode 412 and one of the drain electrodes 414. In some embodiments, and the source electrode 412 and drain electrode 414 are ohmic contacts. The diode D further includes a plurality of p-type layers 417. The p-type layer 417 is disposed between the gate electrode 416 and the active layer 422.

In some embodiments, the active layer 422 includes a channel layer 422a and a barrier layer 422b disposed on the channel layer 422a. A two-dimensional electron gas (2DEG) channel 424 is formed between the channel layer 422a and the barrier layer 422b and in the active region A3. The active layer 422 further includes an insulating region 422c adjacent to the active region A3 to define the shape of the active region A3. For example, in FIG. 12A, the insulating region 422c surrounds the active region A3. The insulating region 422c can have the same structure and material as the insulating region 322c of FIGS. 4A and 4B.

The first terminal 402 of the diode D is disposed on the dielectric layer 334 and is electrically connect with the source electrode 412 through a plug 431. The connector 406 is disposed on the dielectric layer 334, is electrically connect with the drain electrode 414 through a plug 433 and is electrically connect with the gate electrode 416 through a plug 435. The second terminal 404 is disposed on the dielectric layer 334, is electrically connect with another of the drain electrodes 414 through a plug 437 and is electrically connect with another of the gate electrodes 416 through a plug 439. It is noted that the structure of the diode D in FIGS. 12A and 12B are illustrative, and should not limit the present disclosure. In some other embodiments, the diode D of FIG. 11 has other structures.

Figure 13A:
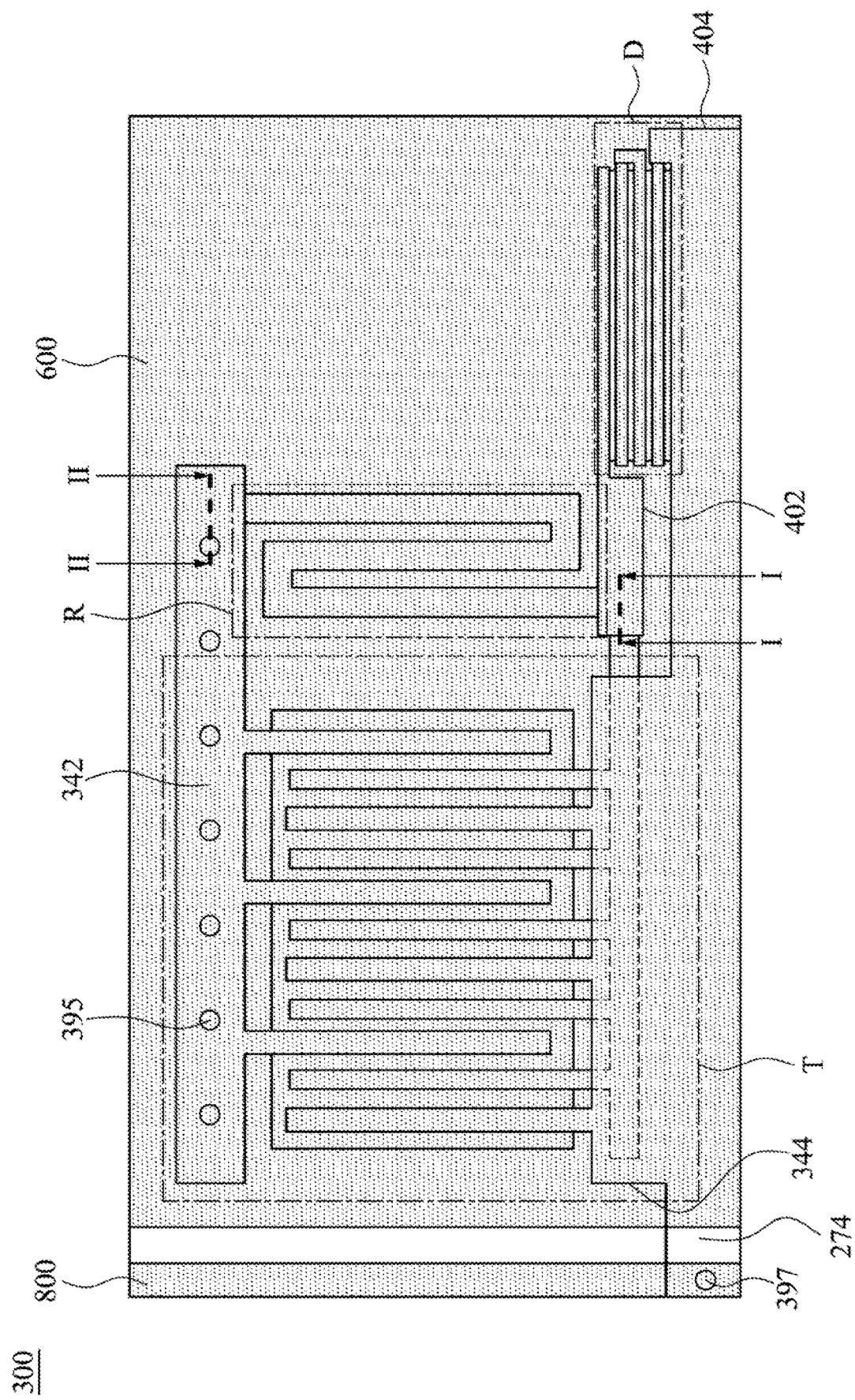
FIG. 13A is a top view of the protection circuit of FIG. 11 according to some embodiments.
Figure 13B:
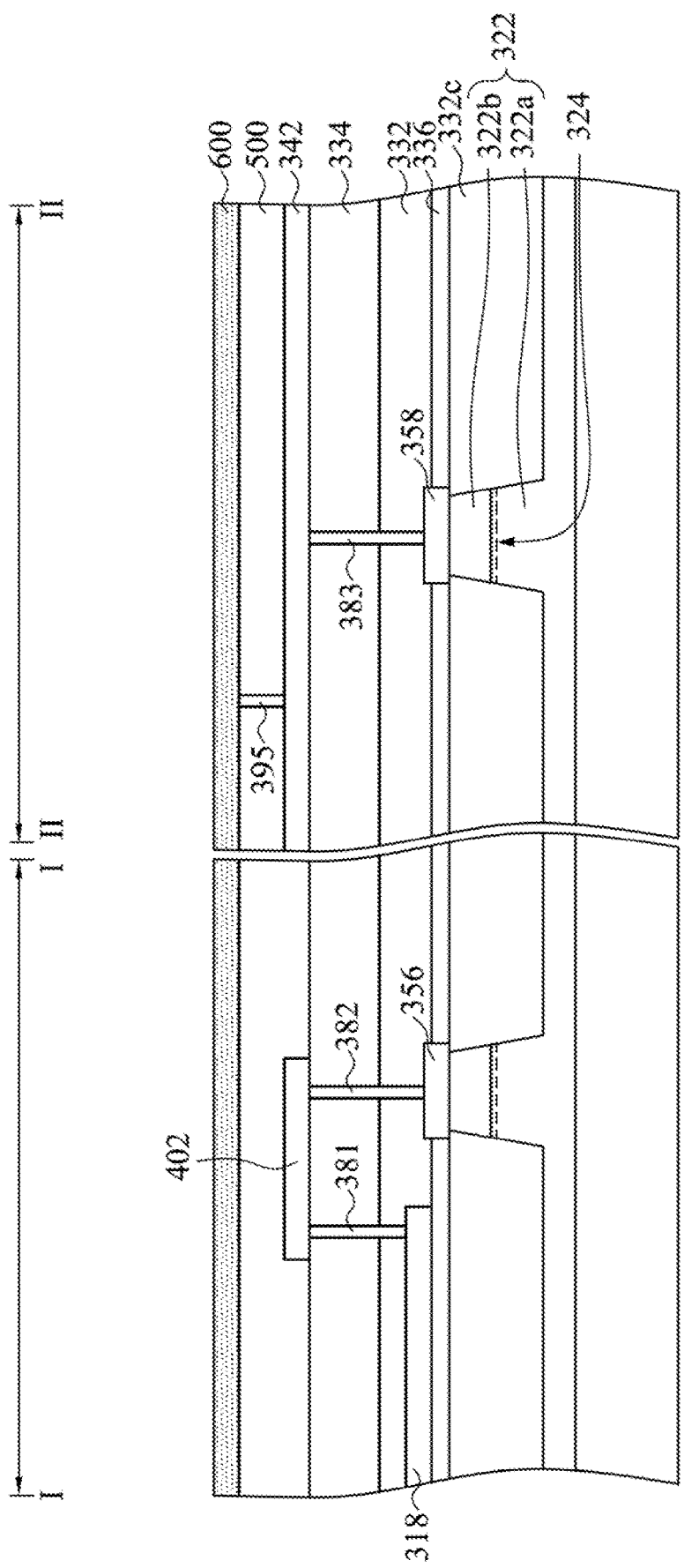
FIG. 13B is a cross-sectional view taking along lines I-I and II-II of FIG. 13A.

FIG. 13A is a top view of the protection circuit 300 of FIG. 11 according to some embodiments, and FIG. 13B is a cross-sectional view taking along lines I-I and II-1I of FIG. 13A. The protection active device T is electrically connected with the resistor R and the diode D. In greater detail, the gate of the protection active device T is electrically connected with the first terminal 356 of the resistor R and the first terminal 402 of the diode D. A plug 381 is disposed in the dielectric layer 332 and 334 and between the first terminal 402 of the diode D and the gate bus bar 318 of the protection active device T, and a plug 382 is disposed in the dielectric layer 332 and 334 and between the first terminal 402 of the diode D and the first terminal 356 of the resistor R. Therefore, the gate of the protection active device T is electrically connected with the first terminal 402 of the diode D and the first terminal 356 of the resistor R through the plug 381, the first terminal 402, and the plug 382.

Furthermore, the source of the protection active device T is electrically connected with the second terminal 358 of the resistor R. For example, a plug 383 is disposed between the source metal layer 342 and the second terminal 358 of the resistor R to interconnect the source metal layer 342 and the second terminal 358. Moreover, the source pad 600 serving as the first terminal 302 (see FIG. 11) of the protection circuit 300 is disposed on the dielectric layer 500. At least one via 395 is disposed in the dielectric layer 500 and between the source pad 600 and the source metal layer 342 to interconnect the source pad 600 and the source metal layer 342. Therefore, both of the source of the protection active device T and the second terminal 358 of the resistor R are electrically connected with the source pad 600 of the protection circuit 300.

The drain of the protection active device T is electrically connected with the second terminal 404 of the diode D. For example, the drain metal layer 344 of the protection active device T and the second terminal 404 of the diode D are integrally formed. Furthermore, the drain metal layer 344 is further electrically connected with the gate pad 800, which is disposed on the dielectric layer 500 and serves as the second terminal 304 (see FIG. 11) of the protection circuit 300, through a via 397 disposed in the dielectric layer 500 and between the gate pad 800 and the drain metal layer 344. The drain metal layer 344 is further electrically connected with the top gate portion 274 of the gate bus bar 270 of the power device 200 (see FIG. 1). It is noted that the interconnection configuration of the protection circuit 300 in FIGS. 13A and 13B are illustrative, and should not limit the claimed scope.

Figure 14A:
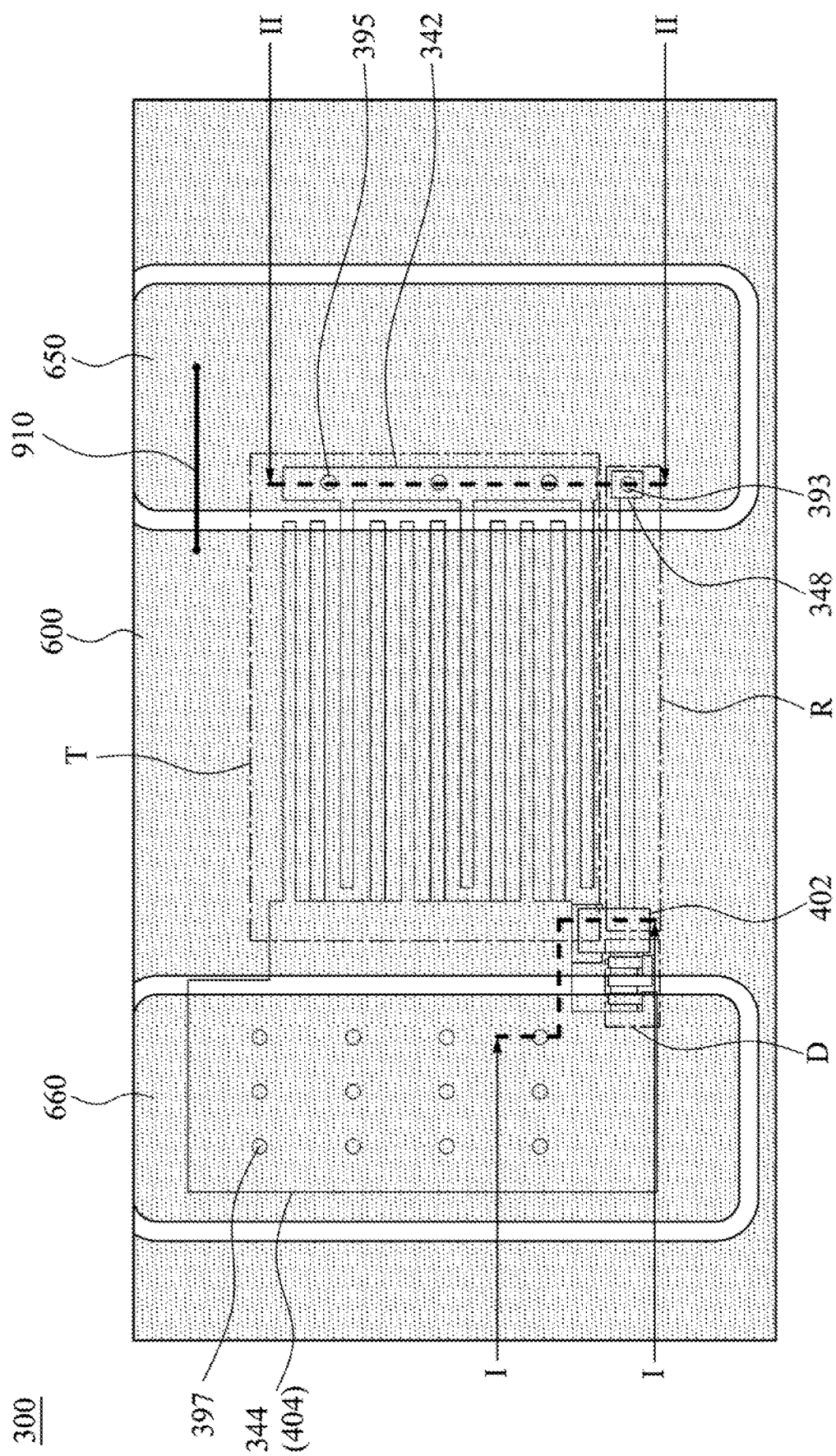
FIG. 14A is a top view of the protection circuit of FIG. 11 and the source pad of FIG. 1 according to some other embodiments.
Figure 14B:
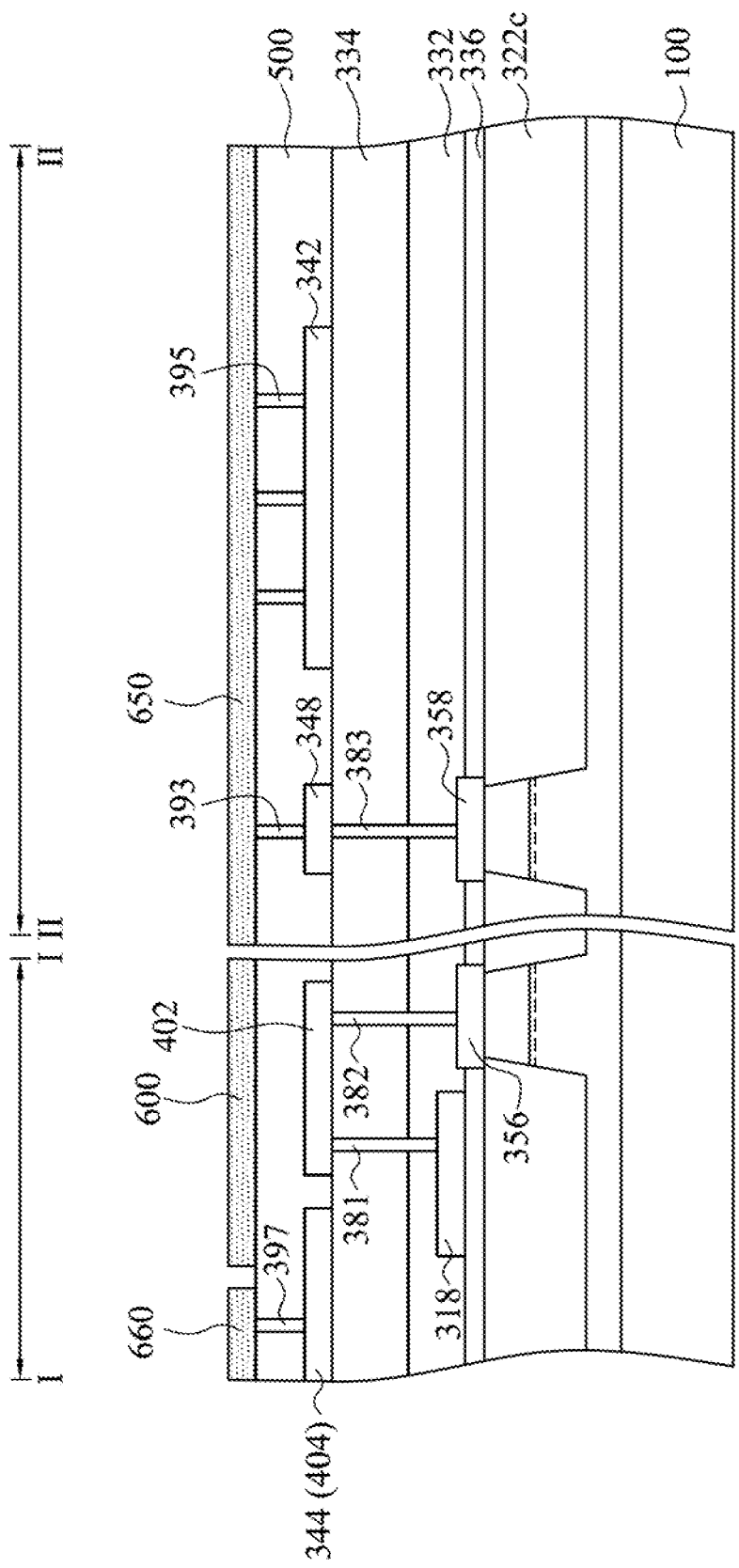
FIG. 14B is a cross-sectional view taking along lines I-I and I-II of FIG. 14A.

FIG. 14A is a top view of the protection circuit 300 of FIG. 11 and the source pad 600 of FIG. 1 according to some other embodiments, and FIG. 14B is a cross-sectional view taking along lines I-I and II-II of FIG. 14A. The protection active device T is electrically connected with the resistor R and the diode D. In greater detail, the gate of the protection active device T is electrically connected with the first terminal 356 of the resistor R and the first terminal 402 of the diode D. A plug 381 is disposed in the dielectric layer 332 and 334 and between the first terminal 402 of the diode D and the gate bus bar 318 of the protection active device T, and a plug 382 is disposed in the dielectric layer 332 and 334 and between the first terminal 402 of the diode D and the first terminal 356 of the resistor R. Therefore, the gate of the protection active device T is electrically connected with the first terminal 402 of the diode D and the first terminal 356 of the resistor R through the plug 381, the first terminal 402, and the plug 382.

Furthermore, the source of the protection active device T is electrically connected with the second terminal 358 of the resistor R. For example, a metal layer 348 is disposed on the dielectric layers 332 and 334, and a plug 383 is disposed between the metal layer 348 and the second terminal 358 of the resistor R to interconnect the metal layer 348 and the second terminal 358. Moreover, a first protection circuit pad 650 serving as the first terminal 302 (see FIG. 11) of the protection circuit 300 is disposed on the dielectric layer 500. At least one via 393 is disposed in the dielectric layer 500 and between the first protection circuit pad 650 and the metal layer 348 to interconnect the first protection circuit pad 650 and the metal layer 348. Furthermore, at least one via 395 is disposed in the dielectric layer 500 and between the first protection circuit pad 650 and the source metal layer 342 to interconnect the first protection circuit pad 650 and the source metal layer 342. Therefore, both of the source of the protection active device T and the second terminal 358 of the resistor R are electrically connected with the first terminal 302 of the protection circuit 300.

The drain of the protection active device T is electrically connected with the second terminal 404 of the diode D. For example, the drain metal layer 344 of the protection active device T and the second terminal 404 of the diode D are integrally formed. Furthermore, the drain metal layer 344 is further electrically connected with a second protection circuit pad 660, which is disposed on the dielectric layer 500 and serves as the second terminal 304 of the protection circuit 300, through a via 397 disposed in the dielectric layer 500 and between the second protection circuit pad 660 and the drain metal layer 344. Furthermore, the source pad 600 is disposed on the dielectric layer 500 and surrounds the first protection circuit pad 650 and the second protection circuit pad 660. For example, the source pad 600 is adjacent to three edges of the first protection circuit pad 650 and the second protection circuit pad 660, and at least part of the source pad 600 is disposed between the first protection circuit pad 650 and the second protection circuit pad 660. It is noted that the interconnection configuration of the protection circuit 300 in FIGS. 14A and 14B are illustrative, and should not limit the claimed scope.

Figure 15A:
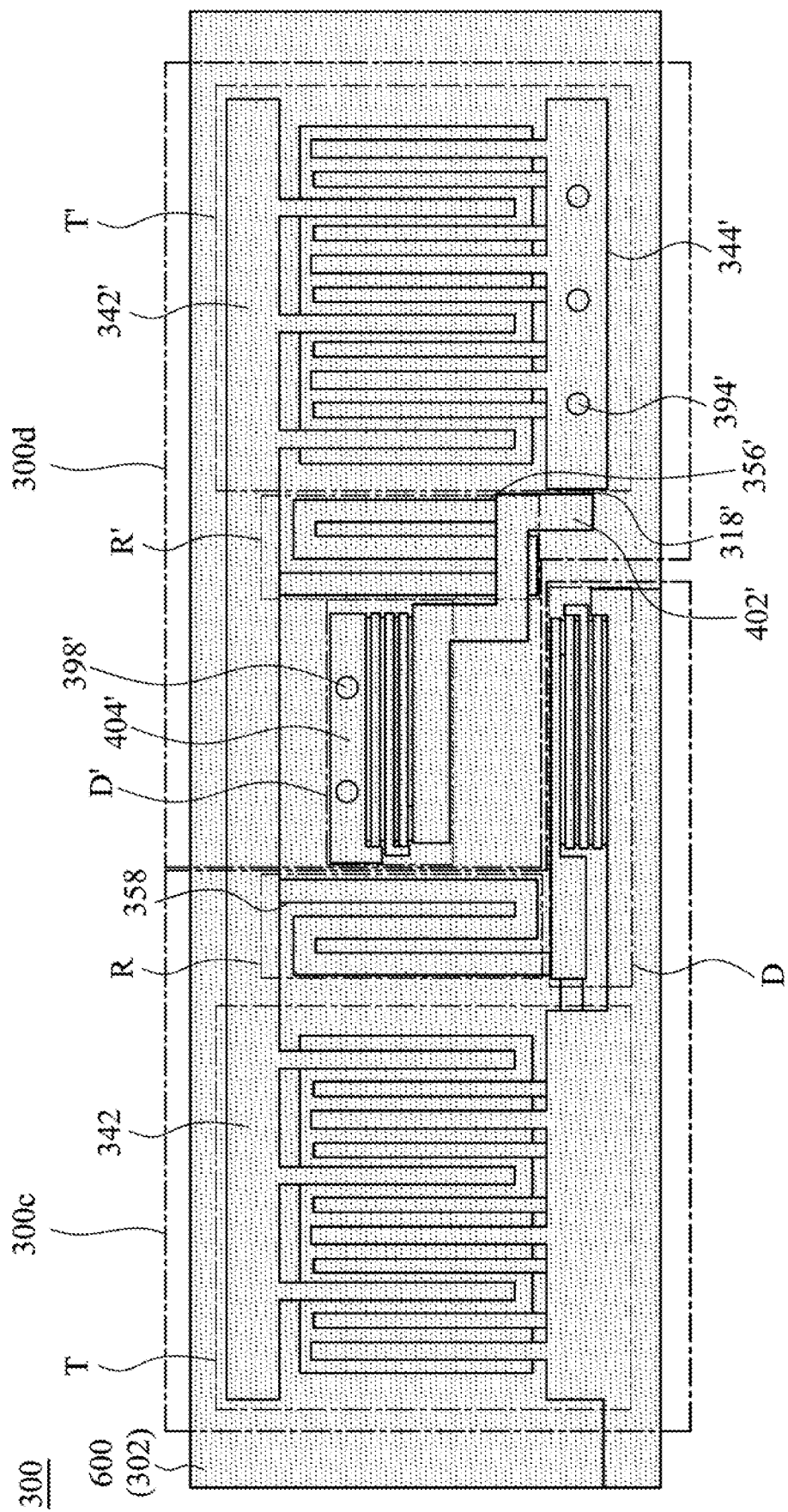
FIG. 15A is a top view of the protection circuit of FIG. 1 and the source pad of FIG. 1 according to some other embodiments.
Figure 15B:
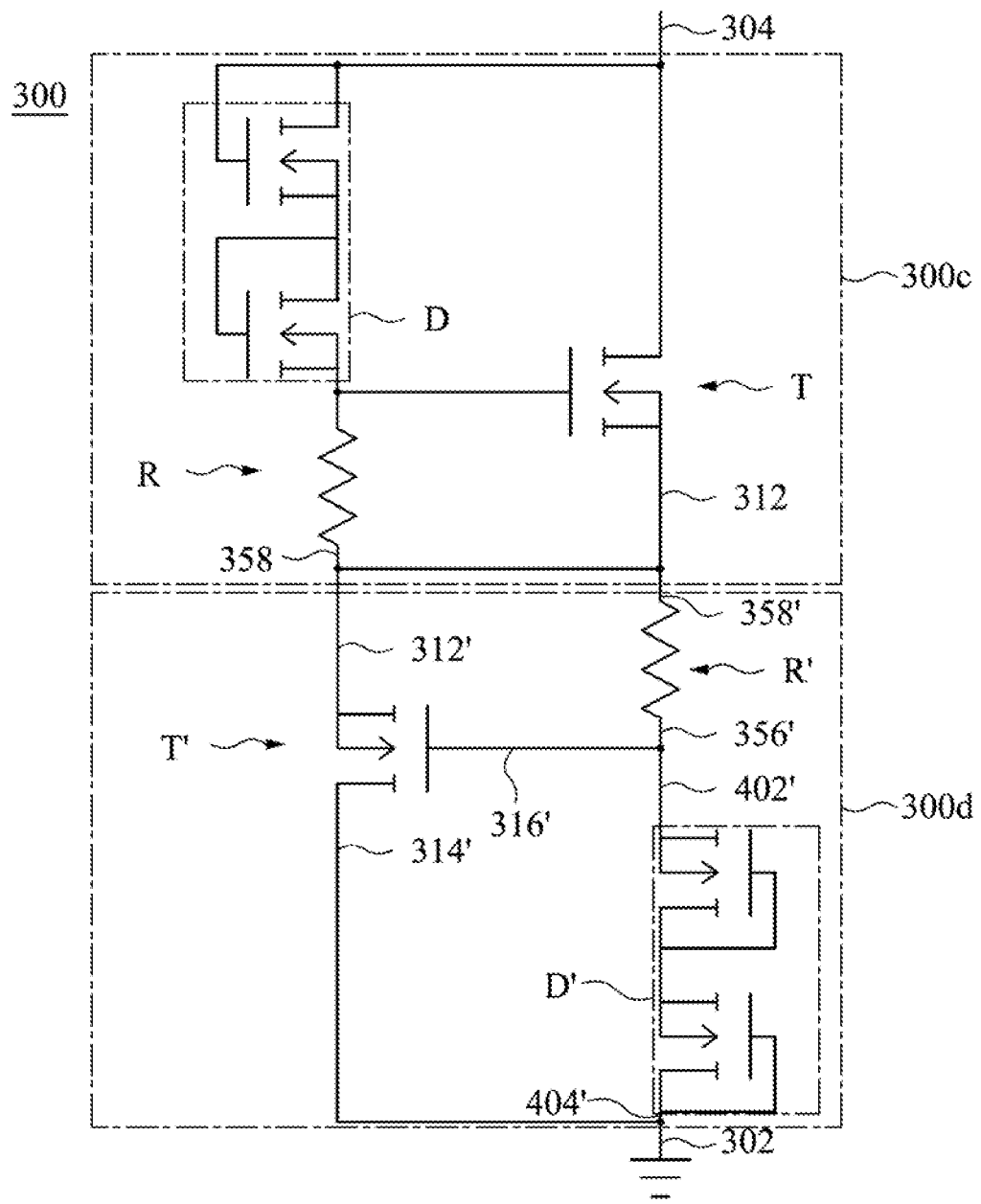
FIG. 15B is a circuit diagram of the protection circuit of FIG. 15A.

FIG. 15A is a top view of the protection circuit 300 of FIG. 1 and the source pad of FIG. 1 according to some other embodiments, and FIG. 15B is a circuit diagram of the protection circuit 300 of FIG. 15A. In this embodiment, the protection circuit 300 includes a first circuit 300c and a second circuit 300d. The first circuit 300c has the similar configuration to the protection circuit 300 of FIG. 13A, and the second circuit 300d has a configuration substantially symmetric to the first circuit 300c. In greater detail, the second circuit 300d includes a protection active device T', a resistor R', and a diode D'. The source electrode 312 (and the source metal layer 342) of the protection active device T is electrically connected with the second terminal 358 of the resistor R, the second terminal 358' of the resistor R', and the source electrode 312' (and the source metal layer 342') of the protection active device T'. The first terminal 356' of the resistor R' is electrically connected with the gate electrode 316' (and the gate bus bar 318') of the protection active device T and the first terminal 40' of the diode D'. The drain electrode 314' (and the drain metal layer 344') of the protection active device T' is electrically connected to the source pad 600 and the second terminal 404' of the diode D'. For example, the second terminal 404' is electrically connected to the source pad 600 through a via 398', and the drain metal layer 344' is electrically connected to the source pad 600 through a via 394'. Other relevant structural details of the second circuit 300d are similar to that of the first circuit 300c, and other relevant structural details of the first circuit 300c are similar to that of the protection circuit 300 of FIGS. 13A and 13B, and, therefore, a description in this regard will not be repeated hereinafter.

Figure 16:
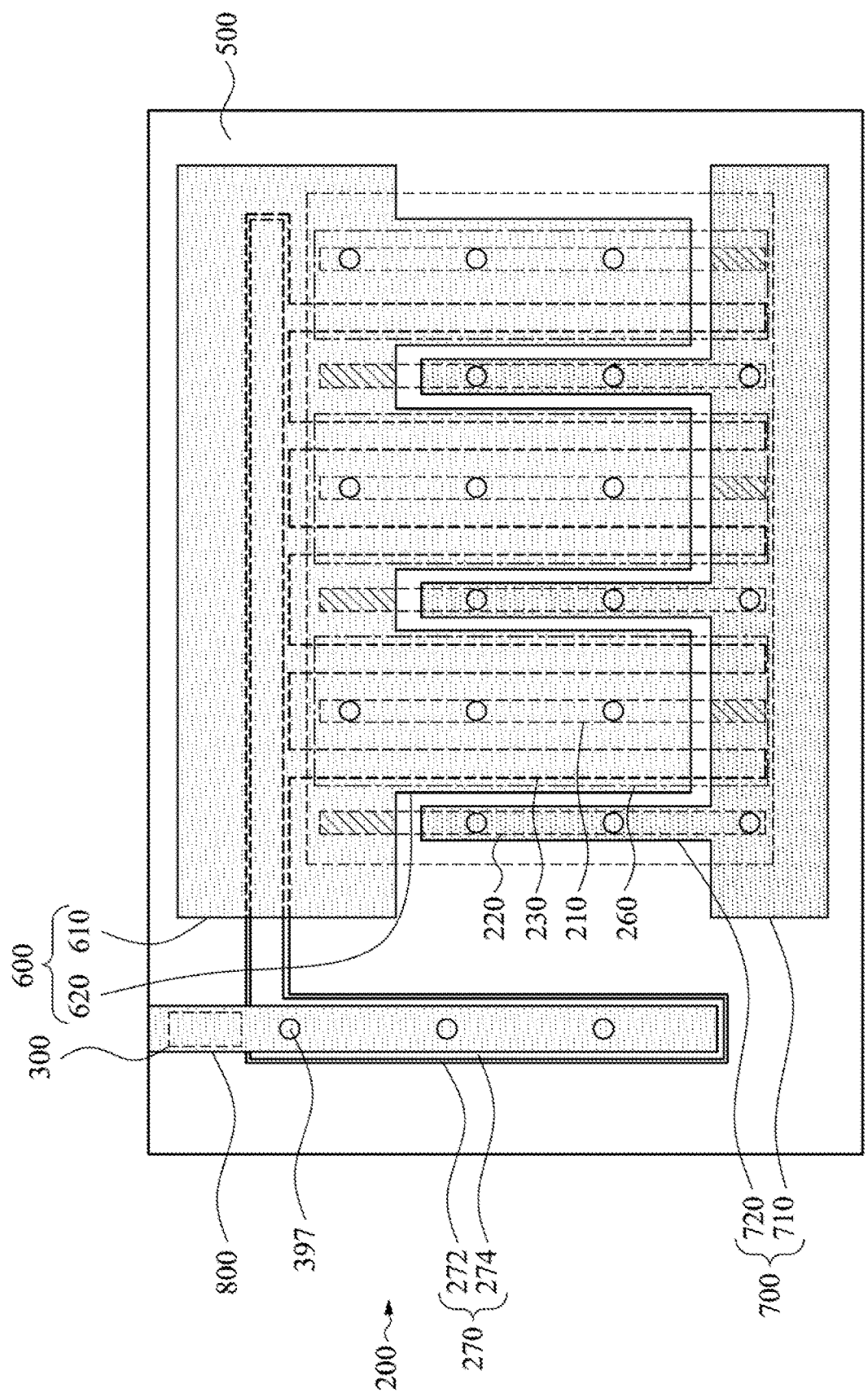
FIGS. 16 and 17 are top view of semiconductor devices according to some embodiments of the present disclosure
Figure 17:
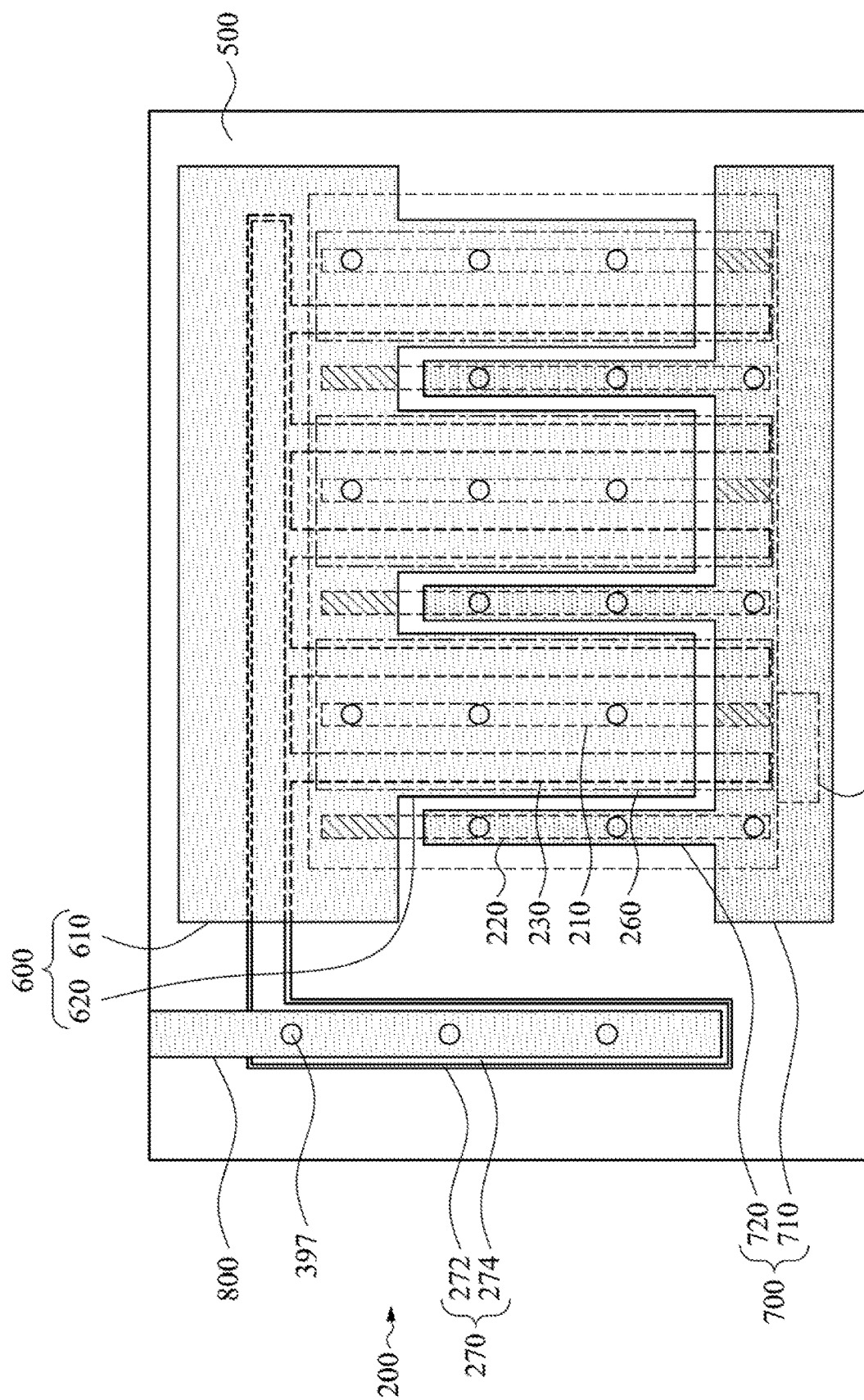

FIGS. 16 and 17 are top view of semiconductor devices according to some embodiments of the present disclosure. In FIG. 16, at least part of the protection circuit 300 is disposed under the gate pad 800. In other words, the gate pad 800 covers at least part of the protection circuits 300. Or, a projection of the protection circuit 300 on the dielectric layer 500 overlaps a projection of the gate pad 800 on the dielectric layer 500. In FIG. 17, at least part of the protection circuit 300 is disposed under the drain pad 700. In other words, the drain pad 700 covers at least part of the protection circuits 300. Or, a projection of the protection circuit 300 on the dielectric layer 500 overlaps a projection of the drain pad 700 on the dielectric layer 500. Other relevant structural details of the semiconductor devices of FIGS. 16 and 17 are similar to the semiconductor device of FIG. 1, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:
1. A semiconductor device comprising:
   a substrate;
   a power device disposed on the substrate, the power device comprising a drain electrode, a source electrode and a gate electrode;
   a protection circuit disposed on the substrate and having a first terminal and a second terminal, the protection circuit further comprises:
      a protection active device having a source electrode, a drain electrode, and a gate electrode, the source electrode of the protection active device being electrically connected with the first terminal of the protection circuit, and the drain electrode of the protection active device being electrically connected with the second terminal of the protection circuit;
      a first capacitor electrically connected between the source electrode of the protection active device and the gate electrode of the protection active device, wherein the first capacitor has a top electrode and a bottom electrode, and the entire bottom electrode of the first capacitor is located below the top electrode of the first capacitor;
   a dielectric layer disposed on the power device and protection circuit;
   a drain pad disposed on the dielectric layer and electrically connected with the drain electrode of the power device;
   a source pad disposed on the dielectric layer and electrically connected with the source electrode of the power device and the first terminal;
   a gate pad disposed on the dielectric layer and electrically connected with the gate electrode of the power device and the second terminal, and
   wherein at least part of the protection circuit is disposed under the source pad, the gate pad, or the drain pad.

2. The semiconductor device of claim 1, further comprising a first protection circuit pad disposed on the dielectric layer, wherein the first protection circuit pad is electrically connected with the first terminal and surrounded by the source pad.

3. The semiconductor device of claim 2, wherein the first protection circuit pad is electrically connected with the source pad through a wire.

4. The semiconductor device of claim 1, further comprising a second protection circuit pad disposed on the dielectric layer, wherein the second protection circuit pad is electrically connected with the second terminal and surrounding by the source pad.

5. The semiconductor device of claim 1, further comprising:
a first protection circuit pad disposed on the dielectric layer and electrically connected with the first terminal of the protection circuit; and
a second protection circuit pad disposed on the dielectric layer and electrically connected with the second terminal of the protection circuit, wherein at least part of the source pad is disposed between the first protection circuit pad and the second protection circuit pad.

6. The semiconductor device of claim 1, wherein the source pad comprises:
a body portion covering the protection circuit; and
at least one branch portion disposed on the source electrode of the power device and connected to the body portion.

7. The semiconductor device of claim 1, wherein at least part of the protection circuit is disposed under the source pad.

8. The semiconductor device of claim 1, wherein at least part of the protection circuit is disposed under the gate pad.

9. The semiconductor device of claim 1, wherein the protection active device further has a source electrode and a gate electrode, the source electrode is electrically connected with the first terminal of the protection circuit, and the protection circuit comprises:
a second capacitor electrically connected between the drain electrode and the gate electrode of the protection active device;
and
a resistor electrically connected between the source electrode and the gate electrode of the protection active device.

10. The semiconductor device of claim 9, wherein the second capacitor comprises:
a bottom electrode electrically connected to the gate electrode of the protection active device; and
a top electrode electrically connected to the drain electrode of the protection active device.

11. The semiconductor device of claim 10, wherein the bottom electrode of the second capacitor and the gate electrode of the protection active device are integrally formed.

12. The semiconductor device of claim 1, wherein the
bottom electrode of the first capacitor is electrically connected to the gate electrode of the protection active device; and
the top electrode of the first capacitor is electrically connected to the source electrode of the protection active device.

13. The semiconductor device of claim 1, wherein the bottom electrode of the first capacitor and the gate electrode of the protection active device are integrally formed.

14. The semiconductor device of claim 1, wherein the protection circuit comprises a first circuit and a second circuit electrically connected to and mirror symmetric to the first circuit.

15. The semiconductor device of claim 1, wherein the protection circuit further comprises:
a diode electrically connected between the drain electrode of the protection active device and the gate electrode of the protection active device; and
a resistor electrically connected between the source electrode of the protection active device and the gate electrode of the protection active device.

16. The semiconductor device of claim 15, wherein the diode comprises:
an active layer;
a source electrode, a drain electrode, and a gate electrode disposed on the active layer, wherein the drain electrode of the diode is electrically connected to the gate electrode of the diode.

17. The semiconductor device of claim 1, wherein the power device further comprises an active layer, the source electrode, the drain electrode, and the gate electrode of the power device are disposed on the active layer, a projection of the source pad on the active layer forms an source pad region, a projection of the drain electrode of the power device on the active layer forms a drain region, and an area of an overlapping region between the source pad region and the drain region is smaller than or equal to 40% of an area of the drain region.

18. The semiconductor device of claim 17, wherein a projection of the drain pad on the active layer forms an drain pad region, a projection of the source electrode of the power device on the active layer forms a source region, and an area of an overlapping region between the drain pad region and the source region is smaller than or equal to 40% of an area of the source region.

19. The semiconductor device of claim 1, wherein the protection active device further comprises:
an active layer:
the source electrode, the drain electrode, and the gate electrode disposed on the active layer;
a gate bus bar disposed on the active layer and electrically connected to the gate electrode;
a source metal layer disposed on the source electrode and electrically connected to the source electrode, wherein the source metal layer comprises:
a body portion; and
at least one branch portion disposed on the source electrode of the protective active device and electrically connected to the source electrode of the protective active device and the body portion; and
a drain metal layer disposed on the drain electrode and electrically connected to the drain electrode.

20. The semiconductor device of claim 1, wherein the protection circuit comprises a resistor comprising:
an active path comprising a two-dimensional electron gas channel;
an insulating region surrounding the active path; and
a first terminal and a second terminal respectively disposed on two ends of the active path.

* * * * *